US005867940A

United States Patent [19]

Watanaba et al.

[11] Patent Number: 5,867,940

[45] Date of Patent: Feb. 9, 1999

[54] POWERED SLIDING DEVICE FOR A VEHICLE SLIDING DOOR

[75] Inventors: Hirofumi Watanaba; Manabu Nakajima, both of Yamanashi-ken, Japan

[73] Assignee: Mitsui Kinzoku Kogyo Kabushiki Kaisha, Tokyo, Japan

[21] Appl. No.: 826,494

[22] Filed: Apr. 3, 1997

[30] Foreign Application Priority Data

| | | | |
|---|---|---|---|
| Apr. 4, 1996 | [JP] | Japan | 8-108578 |
| Apr. 25, 1996 | [JP] | Japan | 8-128967 |
| May 30, 1996 | [JP] | Japan | 8-159051 |

[51] Int. Cl.[6] .......... E05F 11/00

[52] U.S. Cl. .......... 49/360; 49/138

[58] Field of Search .......... 49/360, 280, 279, 49/138, 139, 140

[56] References Cited

U.S. PATENT DOCUMENTS 5,323,570 6/1994 Kuhlman et al. .......... 49/360

5,737,875 4/1998 Dowling et al. .......... 49/360

*Primary Examiner*—Jerry Redman

*Attorney, Agent, or Firm*—Browdy and Neimark

[57] ABSTRACT

A powered sliding device for sliding a vehicle door comprises a base plate, a wire drum rotatably mounted on the base plate by a drum shaft and rotated by a motor, a wire cable for pulling the door in an opening direction or in a closing direction when the wire drum rotates, a tension shaft slidably mounted on the base plate in a given direction and having a tension roller, a movable member slidably mounted on the base plate in a direction perpendicular to the given direction, and a coupling member having one end rotatably connected to the tension shaft and the other end rotatably connected to the movable member. The given direction coincides with a radial direction of the drum shaft. Each side of a contact portion of the wire cable relatively to the tension roller extends straight toward the wire drum.

8 Claims, 20 Drawing Sheets

REAR SIDE
FRONT SIDE
1
2
3
4
5
6
7
8
9
10
11
12
15
16
17
18
19
21
52
67
97
98
110
111

POWERED SLIDING DEVICE FOR A VEHICLE SLIDING DOOR

FIELD OF THE INVENTION

The present invention relates to a powered sliding device for sliding a vehicle door along a guide rail fixed to a vehicle body by using a wire cable provided between the powered sliding device and the vehicle door, and more particularly to a tension apparatus for the wire cable of the powered sliding device.

DESCRIPTION OF PRIOR ART

Generally a conventional powered sliding device comprises a base plate fixed to a vehicle body, a wire drum rotatably mounted on the base plate by a drum shaft and rotated by a motor, a wire cable provided between a sliding door and the wire drum for pulling the door in an opening direction or in a closing direction when the wire drum rotates, a tension roller slidably mounted on the base plate in a given direction for making contact with the wire cable to apply a predetermined tension to the wire cable.

In the powered sliding device the tension pressure applied to the wire cable is very strong, so that in order to move the tension roller for adjusting the tension a knack and relatively large force are required. Further, when moving the tension roller by using a screw driver or like tool, a failure such as a crush of a screw head of the tension roller is often occurred.

SUMMARY OF THE INVENTION

Accordingly, it is an object of the present invention to provide an improved tension apparatus of a powered sliding device in which a tension roller is easily and smoothly moved.

BRIEF DESCRIPTION OF THE DRAWINGS

The above and other objects, features and advantages of the present invention will become apparent from the detailed description of the preferred embodiments found below with reference to the accompanying drawings in which.

DETAILED DESCRIPTION OF THE PREFERRED EMBODIMENTS

Figure 1:
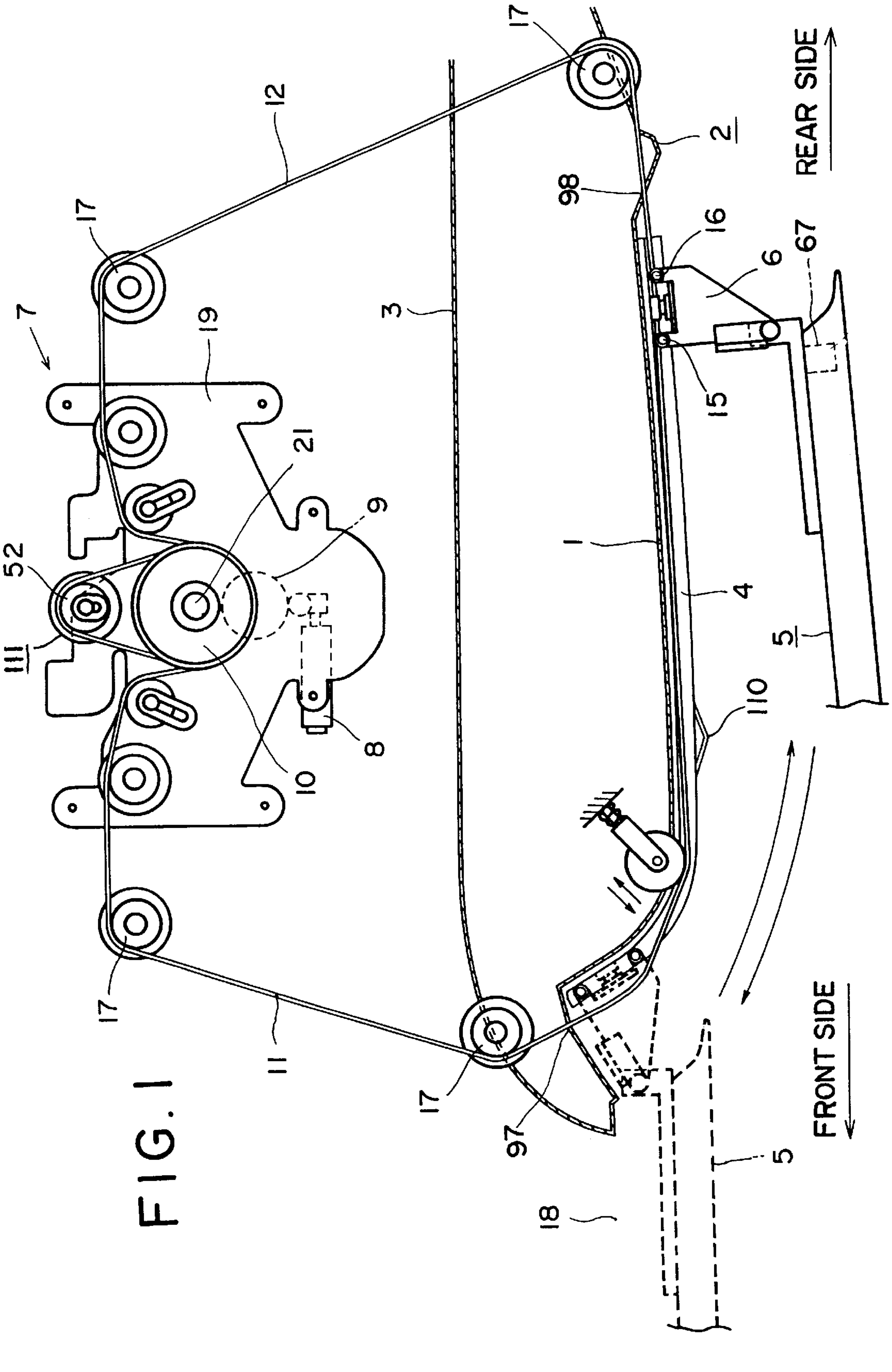
FIG. 1 is a developed sectional view of a rear side portion of a vehicle body according to the present invention.

One embodiment of the present invention will be described with reference to the accompanying drawings. FIG. 1 shows a cross section of a rear side portion of a vehicle body 2. The rear side portion has a rear outer side panel 1, a rear inner side panel 3 corresponding to the outer side panel 1, and a guide rail 4 fixed to an outside surface of the outer side panel 1. A sliding door 5 mounted on the vehicle body 2 has a roller bracket 6 slidably engaged with the guide rail 4 and moves along the guide rail 4 between an open position indicated by a solid line and a closed position indicated by a dotted line.

A powered sliding unit 7 for sliding the door 5 is provided at the rear side portion of the vehicle body 2. Although in FIG. 1, the powered sliding unit 7 is shown in a state in which it is developed with respect to the panels 1 and 3, it is installed in a space between the panels 1 and 3. The sliding unit 7 has a reversible motor 8, a wire drum 10 connected to the motor 8 via a speed reduction mechanism 9, and a pair of wire cables 11, 12. Each of one ends 13, 14 of the wire cables 11, 12 (see FIG. 3) is coupled with the wire drum 10, and each of the other ends 15, 16 of the cables 11, 12 is projected to the outside of the vehicle body 2 through the corresponding one of front and rear cable holes 97, 98 formed in the outer panel 1 and coupled to the roller bracket 6. A plurality of guide pulleys 17 for making contact with the cables 11, 12 are provided at desired positions of the rear side portion of the body 2. Guide plates or rails may be used in place of the pulleys 17.

The sliding door 5 indicated by a solid line in FIG. 1 is held at the open position by a full-open stopper or full-open holder 110 to prevent the door 2 from moving unintentionally on an inclined road. When the wire drum 10 is rotated in a door closing direction by the motor 8, the front cable 11 is wound by the wire drum 10 and the rear cable 12 is pulled out the same amount as the wound amount of the front cable 11. Thereupon, the sliding door 5 is released from the holding force of the full-open stopper 110 to slide in the forward direction, i.e. in the closing direction, then the door 5 closes an entrance 18 of the body 2. On the same principle, when the wire drum 10 is rotated in the opening direction by the motor 8, the door 5 slides in the opening or rearward direction, then the sliding door 5 engages with the full-open stopper 110.

There are various types of the full-open stopper 110. FIG. 1 shows a very simple one which uses a leaf spring. The leaf spring type full-open stopper 110 is preferably installed at a lower portion of the vehicle body 2 hidden from view during normal usage. When the door 5 slides to a full-open position, a protrusion or roller (not shown) of the sliding door 5 elastically gets over the leaf spring, and thereafter the door 5 is held at the full-open position by elastic force of the stopper 110.

Figure 2:
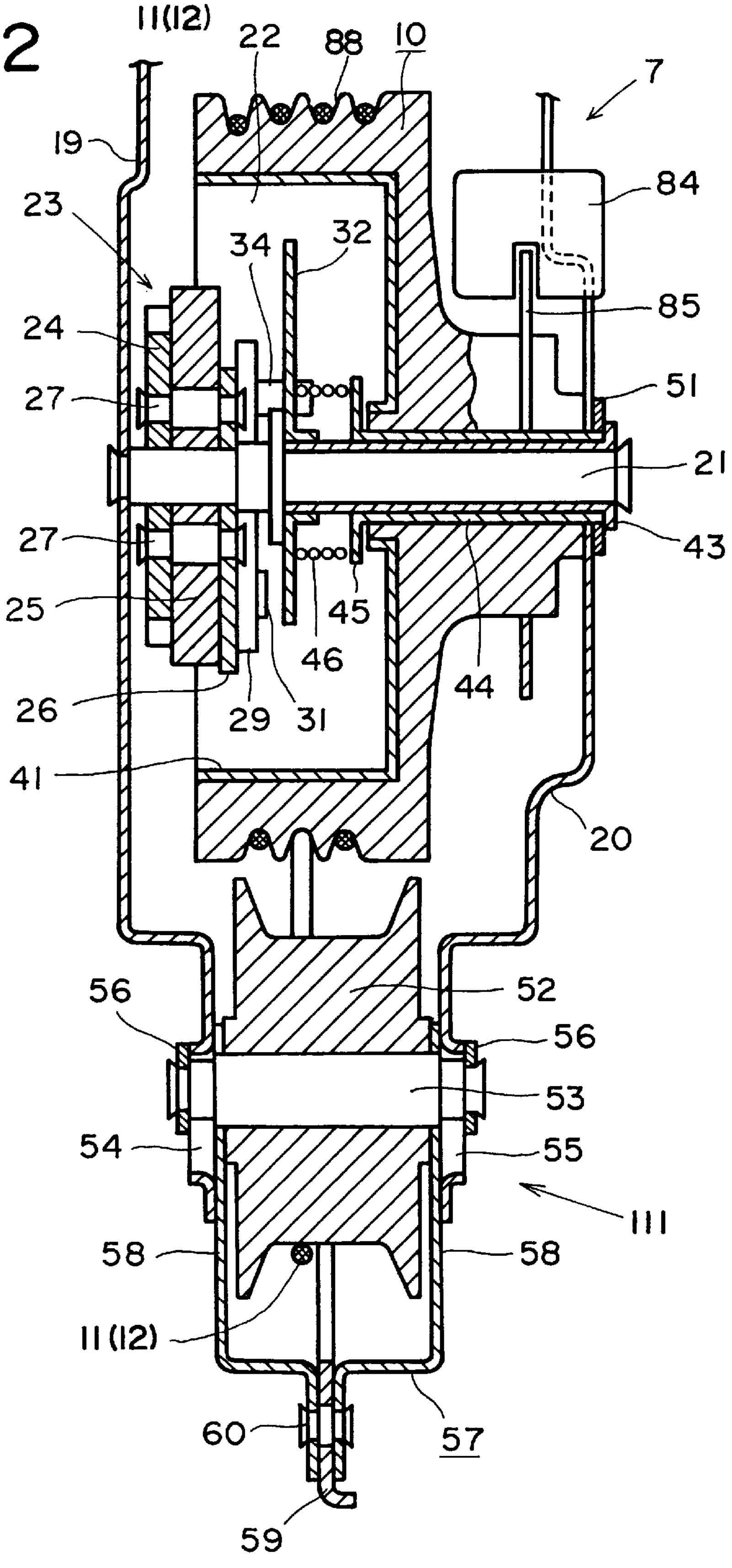
FIG. 2 is a sectional view of a powered sliding unit of the first embodiment according to the present invention.
Figure 3:
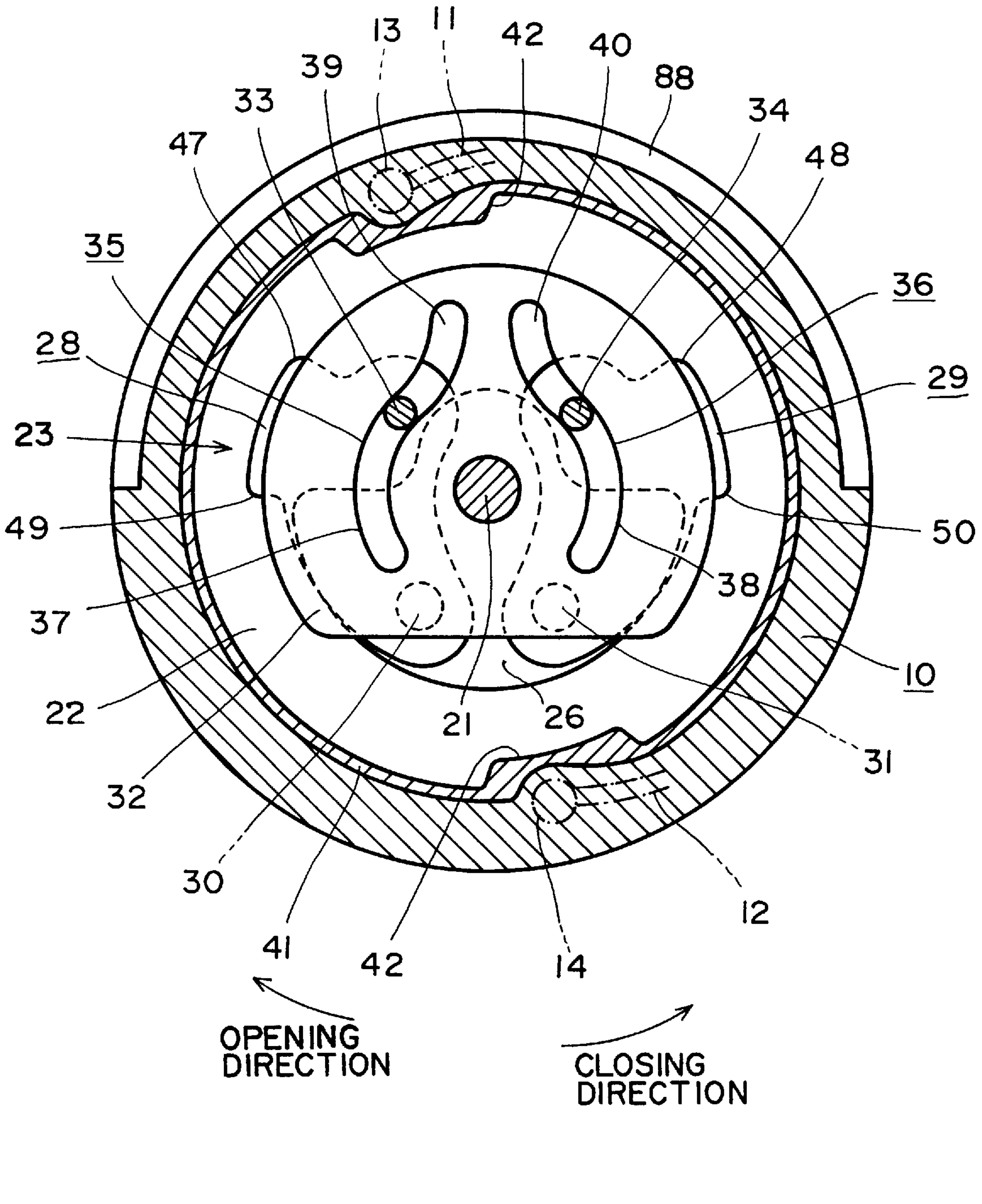
FIG. 3 is a sectional view of a wire drum of the first embodiment.

FIGS. 2 and 3 show a cross section of the wire drum 10. The wire drum 10 is supported by a drum shaft 21 between a base plate 19 of the powered sliding unit 7 and a cover plate 20 fixed to the base plate 19 with a predetermined distance. The wire drum 10 is formed into a cylindrical shape having one closed side and the other open side, and has on its annular outer surface wire grooves 88 in which the cables 11 and 12 are fitted. Inside of the wire drum 10 is formed a relatively large inner space 22 in which a clutch mechanism 23 for transmitting rotational force of the motor 8 (speed reduction mechanism 9) to the wire drum 10 is substantially received.

A gear 24 as a final gear of the speed reduction mechanism 9 is rotatably mounted on the end portion of the drum shaft 21. A reinforcing member 25 and a rotary disk 26 are fixed to the gear 24 by means of pins 27 so that these members are integrally rotated with each other. Thus, the gear 24 and reinforcing member 25 are omitted in FIGS. 3, 8 and 9 for simplicity of drawings. The gear 24 rotates independently with respect to the drum shaft 21. To fix the gear 24 to the drum shaft 21, it is necessary to install expensive bearings between the drum shaft 21 and the plates 19, 20. Also, if the bearings are used, the distance between the base plate 19 and the cover plate 20 becomes long, so that the sliding unit 7 is made large.

An inner sleeve 43 is fixed at the outer periphery of the drum shaft 21, and an outer sleeve 44 is provided between the inner sleeve 43 and the wire drum 10. Frictional resistance between the outer sleeve 44 and the wire drum 10 is decreased to the utmost. An operation ring 51 is fixed to the exposed end of the outer sleeve 44. A guide plate 32 is supported by the inner sleeve 43. A spring 46 is provided between the guide plate 32 and a flange 45 formed in the outer sleeve 44 so that the guide plate 32 is rotated by external force via the spring 46 when the operation ring 51 is rotated with a tool such as pliers. The operation ring 51 (outer sleeve 44) is rotated by the tool when a coupling state of the clutch mechanism 23 is manually released. The manual release will be discussed below.

The spring 46 fulfills a function of producing frictional resistance between the guide plate 32 and the drum shaft 21 (inner sleeve 43) as well as a function of connecting the outer sleeve 44 to the guide plate 32. In a second embodiment of the present invention shown in FIG. 11, the spring **46*a* has only a function of producing frictional resistance between the guide plate 32*a* and the drum shaft 21*a*. In this second embodiment, the spring 46*a* is arranged between the flange 45*a* formed on an inner sleeve 43*a* and the guide plate 32*a***.

A pair of swinging arms 28, 29 are rotatably attached to the rotary disk 26 by means of pins 30, 31 and have sliding pins 33, 34, respectively. The guide plate 32 has a pair of guide slots 35, 36 in which the sliding pins 33, 34 are slidably engaged, respectively. The guide slots 35, 36 are comprised of respective arcuate slots 37, 38 with a radius around the drum shaft 21 and respective extension slots 39, 40 extending from the corresponding one of ends of the arcuate slots 37, 38 in a direction apart from the drum shaft 21 as shown in FIG. 3.

A drum inner 41 with a high wear resistance and shock resistance is preferably installed on the inside surface of the wire drum 10, as shown in FIGS. 2 and 3. The drum inner 41 is formed with a plurality of convex portions swelling toward the drum shaft 21. Although two convex portions are formed in the drum inner 41 of the first embodiment shown in FIG. 3, many convex portions **42*a* may sometimes be formed as the second embodiment shown in FIG. 12. Many convex portions facilitate the manual releasing operation of the coupling state of the clutch mechanism 23** as mentioned later.

Figure 8:
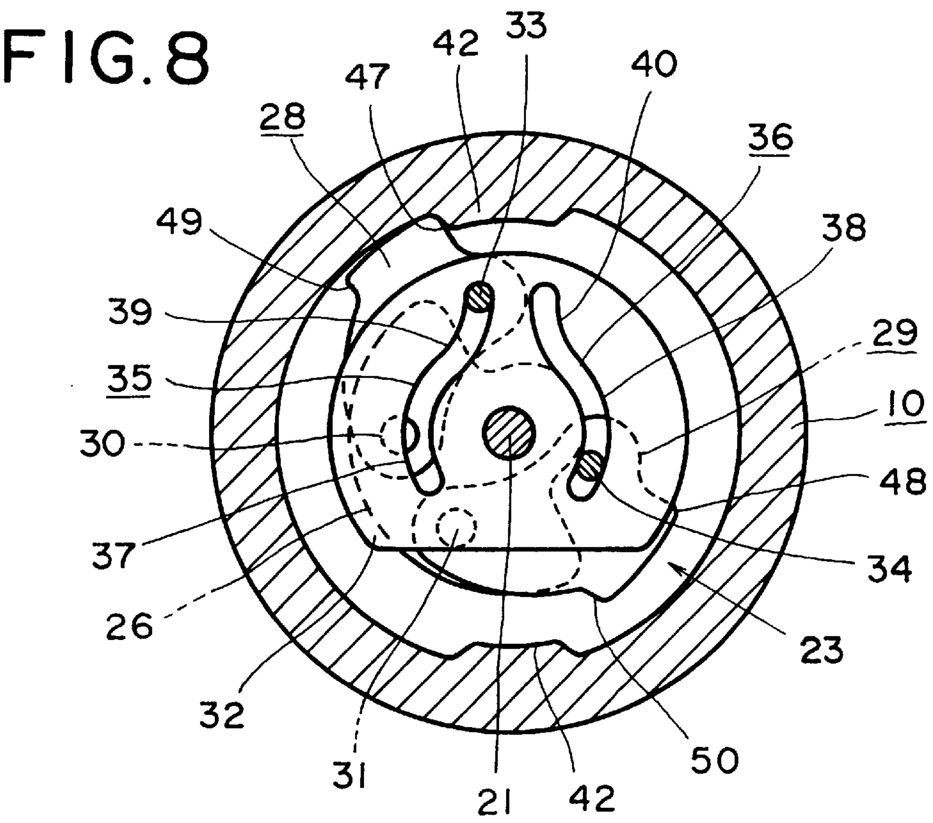
FIG. 8 is a partially sectional view showing a clutch mechanism in a coupling state.
Figure 9:
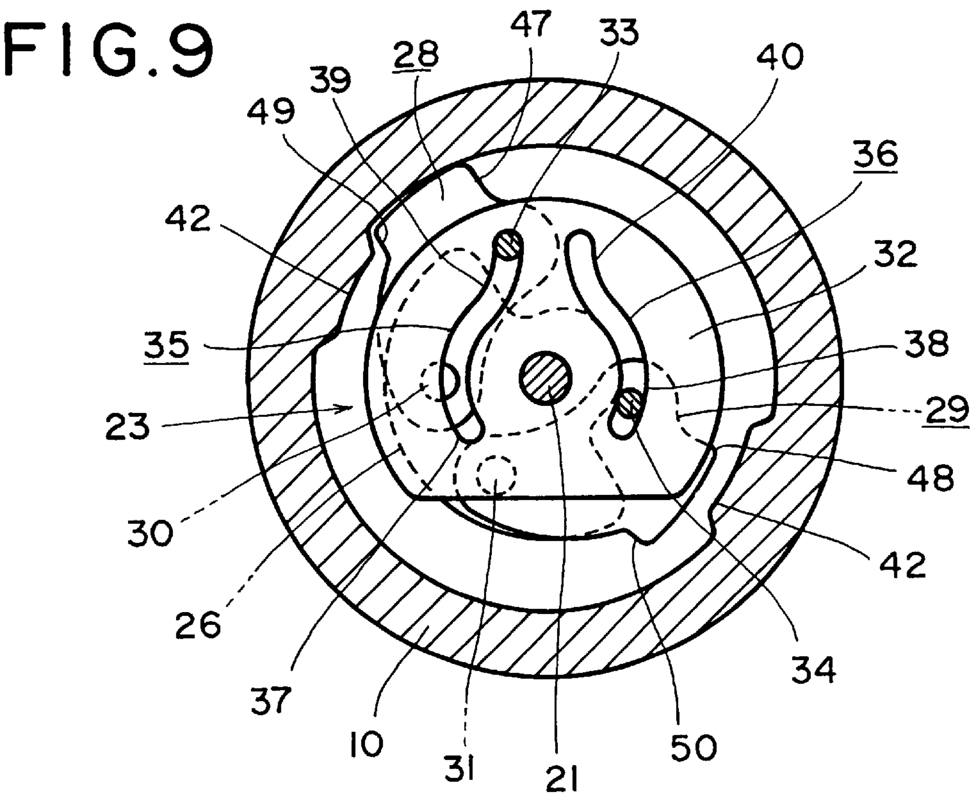
FIG. 9 is a partially sectional view for illustrating a manual release of the coupling state of the clutch mechanism.

The clutch mechanism 23 of the present invention is composed of the rotary disk 26, the guide plate 32, the swinging arms 28, 29, and the convex portions 42. The rotary disk 26 and the guide plate 32 are set so as to be positioned as shown in FIG. 3 when the motor 8 is not energized. In the state shown in FIG. 3, each of the sliding pins 33, 34 of the swinging arms 28, 29 pivotally mounted to the rotary disk 26 is positioned at the corresponding one of the boundary portions between the arcuate slots 37, 38 and the extension slots 39, 40. Clutch claws 47, 48 for selectively engaging with the convex portions 42 of the wire drum 10 (or drum inner 41) are formed at the tip ends of the swinging arms 28, 29, respectively. When either of clutch claws 47, 48 is engaged with the convex portion 42 as shown in FIG. 8, the clutch mechanism 23 becomes in the coupling state. As shown in FIG. 3, when both the clutch claws are not engaged with the convex portion 42, the clutch mechanism 23 is in an uncoupling state.

The switching of the clutch mechanism 23 from the uncoupling state to the coupling state will be explained. When the rotary disk 26 is rotated clockwise by the motor 8 in the uncoupling state shown in FIG. 3, the swinging arms 28, 29 connected to the rotary disk 26 by means of the pins 30 and 31 are also rotated. At this time, since the guide plate 32 is given the frictional resistance by the elastic force of the spring 46, the sliding pin 33 of the swinging arm 28 moves from the arcuate slot 37 of the guide plate 32 to the extension slot 39, whereby the swinging arm 28 is swinged, in a direction apart from the drum shaft 21, about the pin 30 as a center, so that the clutch claw 47 of the swinging arm 28 is engaged with the convex portion 42 of the wire drum 10 as shown in FIG. 8. On the other hand, the sliding pin 34 of the swinging arm 29 moves in the arcuate slot 38 from its one end to its other end. However, since the arcuate slot 38 is of an arc shape with the drum shaft 21 as a center, the clutch claw 48 of the swinging arm 29 is not swung toward the convex portion 42 and the distance between the clutch claw 48 and the drum shaft 21 is kept in constant. When the motor 8 is continuously rotated after the engagement between the clutch claw 47 and the convex portion 42, the rotational force of the motor 8 is transmitted to the wire drum 10 via the engagement of the clutch claw 47 with the convex portion 42, so that the rear cable 12 is wound by the wire drum 10 and the front cable 11 is pulled out the same amount as the wound amount of the rear cable 12, whereby the sliding door 5 moves toward the open position. At this time, the guide plate 32 rotates together with the rotary disk 26 by the contact of the pin 33 with the end of the extension slot 39.

Contrarily, when the rotary disk 26 is rotated counterclockwise by the force of the motor 8 in the uncoupling state shown in FIG. 3, the opposite clutch claw 48 of the swinging arm 29 moves in a direction apart from the drum shaft 21, so that it engages with the convex portion 42. As a result, the sliding door 5 moves toward the door closed position. Thus, when the rotary disk 26 is rotated in either direction by the motor 8, either of the clutch claws 47, 48 engages with the convex portion 42, whereby the clutch mechanism 23 becomes in the coupling state, so that the rotation of the rotary disk 26 is mechanically transmitted to the wire drum 10.

In the present invention, the stopping of the rotation of the motor 8 does not cause the clutch mechanism 23 to return to the uncoupling state. For example, if the rotation of the motor 8 is stopped by deenergizing the motor 8 while the sliding door is being moved toward the door open position, the clutch claw 47 remains being engaged with the convex portion 42 as shown in FIG. 8. In this state, the wire drum 10 can be rotated clockwise, but it is substantially impossible to rotate the wire drum 10 counterclockwise because of the engagement of the clutch claw 47 with the convex portion 42. This means that the sliding door 5 cannot be moved manually toward the door closed position. Therefore, the device of the present invention is so configured that before stopping the motor 8 by deenergizing, the motor 8 is rotated in the reverse direction for a predetermined time or by a predetermined amount to return the clutch mechanism 23 to the uncoupling state. That is, when the coupling state shown in FIG. 8 is established by rotating the motor 8 in the opening direction, after the motor 8 is rotated in the closing direction by the predetermined amount, the rotation of the motor 8 is stopped. When the rotary disk 26 is rotated counterclockwise from the state shown in FIG. 8 by the reverse rotation of the motor 8, the sliding pin 33 of the swinging arm 28 is moved from the extension slot 39 toward the boundary portion between the arcuate slot 37 and the extension slot 39 with swinging the arm 28 about the pin 30 toward the drum shaft 21. When the reverse rotation of the motor 8 by the predetermined amount is completed, the sliding pin 33 of the swinging arm 28 is moved to the boundary portion, the clutch mechanism 23 is then returned to the uncoupling state shown in FIG. 3, so that the connection between the wire drum 10 and the motor 8 is released. When the clutch mechanism 23 is in the uncoupling state, the wire drum 10 can be rotated in either direction, so that the sliding door 5 can be slid manually in either direction.

As described above, in the present invention, the clutch mechanism 23 is returned to the uncoupling state by using the power of the motor 8 which is used for sliding the door 5. Therefore, an additional motor or a return spring for displacing the clutch mechanism into the uncoupling state is unnecessary. Further, since the clutch mechanism 23 of the present invention is substantially accommodated in the inner space 22 of the wire drum 10, the construction of the powered sliding unit 7 is thin and small as a whole, so that the installation place of the powered sliding unit 7 can be set relatively freely.

Next, the manual release of the clutch mechanism 23 will be explained. As described above, the device of the present invention is so configured that the coupling state of the clutch mechanism 23 is released by reversely rotating the motor 8 by the predetermined amount. Thereupon, if the motor 8 fails when the clutch mechanism 23 is in the coupling state, the clutch mechanism 23 cannot be released automatically. In such a case, the sliding door 5 should be slid manually in the opening direction or closing direction according to the condition of the clutch mechanism 23. That is, when the clutch claw 47 is engaged with the convex portion 42, the sliding door 5 should be slid in the opening direction, and when the clutch claw 48 is engaged with the convex portion 42, the sliding door 5 should be slid in the closing direction.

For example, in the state as shown in FIG. 8 where the clutch claw 47 is engaged with the convex portion 42, it is not possible to move the sliding door 5 in the closing direction, but possible to move the sliding door 5 in the opening direction. In this state, when the sliding door 5 is moved manually in the opening direction, the wire drum 10 is rotated clockwise in FIG. 8 through the cables 11, 12. At this time, since the frictional resistance between the wire drum 10 and the outer sleeve 44 is very low and the guide plate 32 is given the predetermined frictional resistance by the spring 46, the guide plate 32 is not rotated. When the wire drum 10 is rotated clockwise about 120 degrees in FIG. 8, the other convex portion 42 comes into contact with a cancelling cam face 49 formed in the swinging arm 28. The swinging arm 28 is then swung toward the drum shaft 21 about the pin 30 as a center by the contact between the convex portion 42 and the cam face 49 due to the further rotation of the wire drum 10, since the rotary disk 26 connected with the reduction mechanism 9 cannot be rotated by the external force. Thereby, the clutch mechanism 23 is manually returned to the uncoupling state, and the sliding door 5 can be moved toward the door closed position. Contrarily, if the motor 8 fails when the clutch claw 48 is engaged with the convex portion 42, the sliding door 5 should be slid in the closing direction, and the convex portion 42 comes into contact with a cancelling cam face 50 formed on the swinging arm 29 to release the coupling state of the clutch mechanism 23. If many convex portions are formed on the wire drum as the second embodiment of the present invention shown in FIG. 12, the coupling state of the clutch mechanism **23*a* can be released by a small amount of rotation of the wire drum 10*a***, which facilitates the clutch releasing operation.

The above-described manual release of the coupling state of the clutch mechanism 23 cannot sometimes be applied when the sliding door 5 is at the full-open position or full-closed position. That is, the movement of the sliding door 5 in the opening direction, which is necessary to release the engagement between the clutch claw 47 and the convex portion 42, is substantially impossible when the door 5 is at the full-open position, and the movement of the sliding door 5 in the closing direction, which is necessary to release the engagement between the clutch claw 48 and the convex portion 42, is substantially impossible when the door 5 is at the full-closed position. In such cases, as an emergency measure, the operation ring 51 fixed to the exposed end of the outer sleeve 44 is rotated by using the pliers, whereby the guide plate 32 is rotated via the outer sleeve 44 and the spring 46. In the state as shown in FIG. 8 where the clutch claw 47 is engaged with the convex portion 42, when the guide plate 32 is rotated clockwise, the sliding pin 33 of the swinging arm 28 gradually comes close to the drum shaft 21 by being guided by the extension slot 39, so that the clutch claw 47 goes away from the convex portion 42, by which the coupling state of the clutch mechanism 23 is released. Contrarily, when the clutch claw 48 is engaged with the convex portion 42, the guide plate 32 is rotated counterclockwise by the operation ring 51.

Next, a tension adjusting mechanism 111 will be explained with reference to FIGS. 2 and 4. A pair of elongated holes 54 and 55 extending in the radial direction of the drum shaft 21 are formed in the base plate 19 and the cover plate 20, respectively. Both ends of a tension shaft 53 are slidably engaged with the elongated holes 54, 55 by means of washers 56. To the tension shaft 53 is rotatably supported a tension roller 52 with which either of the front and rear cables 11, 12 makes contact. Both ends of the tension shaft 53 are also pivotally connected to tip ends of a pair of links 58 which form a connecting member 57. The base end of the connecting member 57 is pivotally mounted to a movable member 59 by means of a shaft 60. The movable member 59 is formed into an elongated shape in a direction perpendicular to the sliding direction of the tension shaft 53 equivalent to the radial direction of the drum shaft 21. Both ends of the movable member 59 are attached to the plates 19, 20 by means of pins 61 so as to be slid in the longitudinal direction thereof.

A pinion gear 62 is mounted between the plates 19 and 20 by a shaft 63. The movable member 59 is formed with a rack 64 engaged with the pinion gear 62, so that the movable member 59 is slid when the shaft 63 is rotated. At the top of the shaft 63 is formed an engaging portion 117 with which a tool such as a screw driver is engageable. The pinion gear 62 is provided with a ratchet wheel 65 with which a pawl lever 66 is engaged by resilient force of a spring 109. The pawl lever 66 permits the pinion gear 62 to rotate in a one-way direction.

Figure 4:
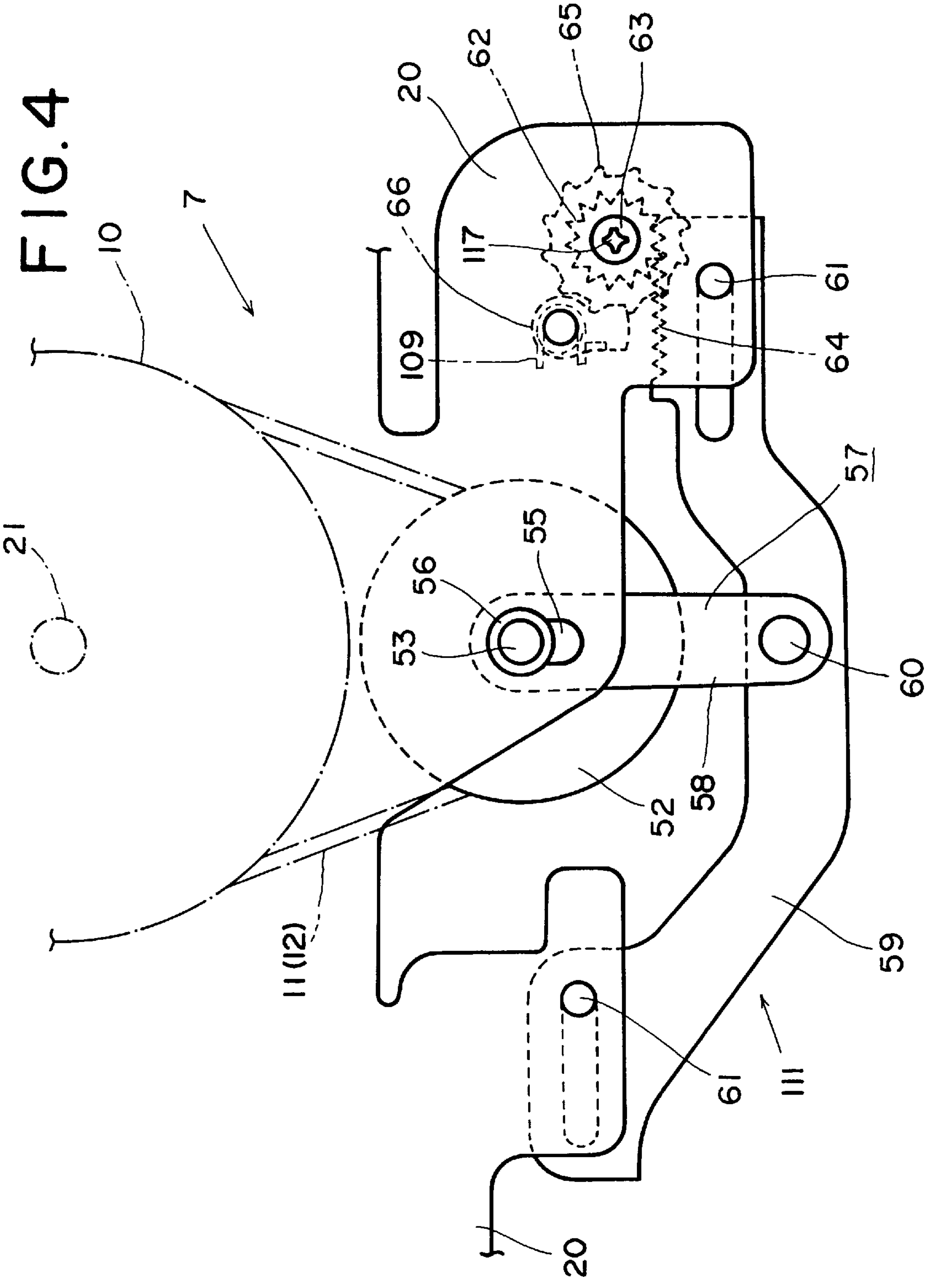
FIG. 4 is an enlarged view of a tension adjusting mechanism of the first embodiment.

The shaft 60 shown in FIG. 4 coincides with an extension line connecting the drum shaft 21 and the hole 55 and is in the closest position to the drum shaft 21. Therefore, the distance between the tension roller 52 and the wire drum 10 is shortest, so that the cables 11, 12 are loosened. When the movable member 59 is slid to the right by the rotation of the pinion gear 62 in FIG. 4, the shaft 60 gradually goes away from the hole 55, and the tension shaft 53 (or tension roller 52) slides in the elongated holes 54 and 55 in a direction such as to go away from the drum shaft 21. Thereupon, the looseness of the wire cables 11, 12 is adjusted. At this time, the travel distance of the tension roller 52 is far shorter than the travel distance of the movable member 59, so that the movable member 59 can be moved smoothly with a small force. Further, since each side of a contact portion of the wire cable 11 or 12 touched with the tension roller 52 is returned to the wire drum 10, the tension of wire cables can be adjusted by a small travel amount of the tension roller 52.

Figure 5:
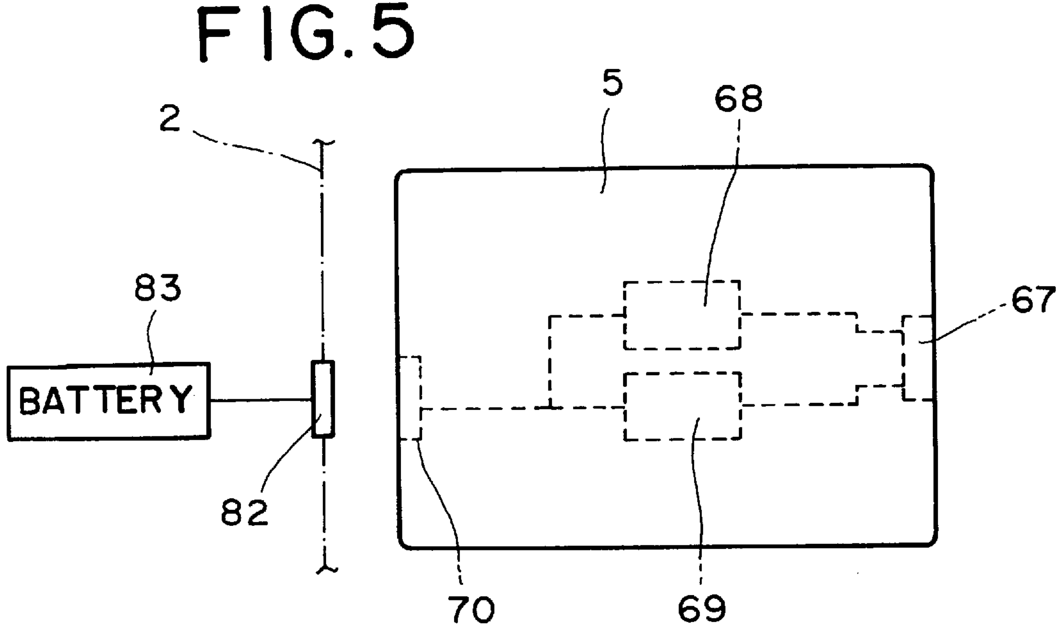
FIG. 5 is a view showing the relationship between an electric connector of the sliding door and an electric connector of the vehicle body.
Figure 6:
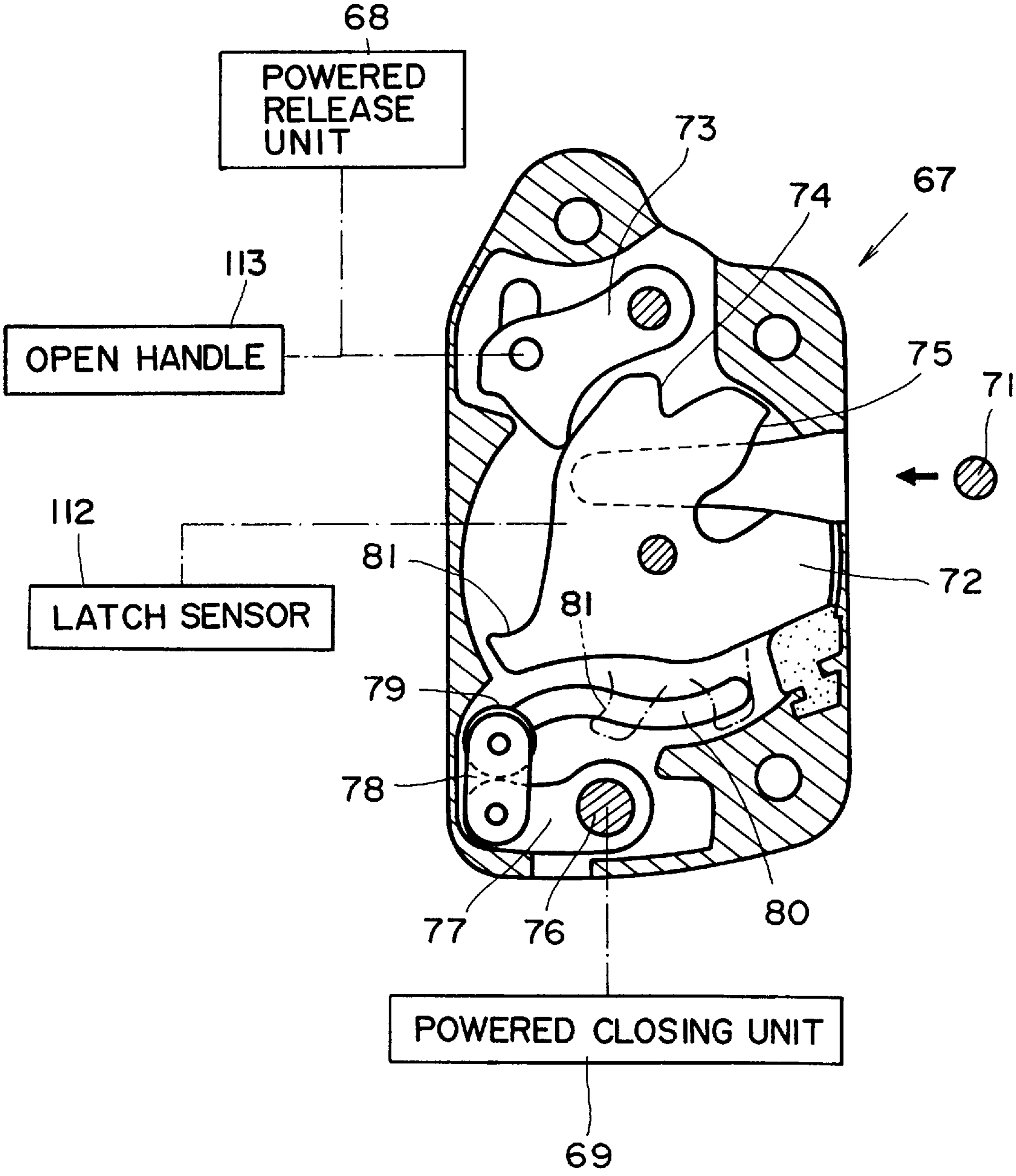
FIG. 6 is a sectional view of a latch unit.

As shown in FIGS. 1 and 5, a latch unit 67 is mounted at the rear end of the sliding door 5. The latch unit 67 has, as shown in FIG. 6, has a latch 72 which is engageable with a striker 71 fixed to the vehicle body 2 and a ratchet 73 which is engageable with the latch 72 to hold the engagement between the latch 72 and the striker 71. When the latch 72 is rotated counterclockwise in FIG. 6 to a half-latch position due to the engagement with the striker 71, the ratchet 73 engages with a half-latch step portion 74 of the latch 72, then the latch unit 67 and the sliding door 5 become in a half-latch state. When the latch 72 is rotated to a full-latch position, the ratchet 73 engages with a full-latch step portion 75 of the latch 72, then the latch unit 67 and the sliding door 5 become in a full-latch state.

The device of the present invention is so configured that the sliding movement of the door 5 in the closing direction by the power of the powered sliding unit 7 is continued until the half-latch state of the door 5 is attained. The movement of the sliding door 5 from the half-latch state to the full-latch state is performed by using a powered closing unit 69. This does not mean that the powered sliding unit 7 has no function of moving the sliding door 5 to the full-latch state or full-latch position. It is possible to make the sliding door 5 in the full-latch state by the powered sliding unit 7 only. In the present invention, the powered close unit 69 is, however, employed to prevent the motor 8 and speed reduction mechanism 9 of the powered sliding unit 7 from becoming large.

The powered closing unit 69 is installed inside the sliding door 5, and connected to a shaft 76 of the latch unit 67. A lever 77 is fixed the shaft 76. At the tip end of the lever 77 is pivotally connected an intermediate link 78 which has a roller 79 slidably engaged with a guide groove 80 formed in the latch unit 67. A latch sensor 112 for detecting the half-latch and full-latch states of the door 5 by monitoring the rotational position of the latch 72 is connected to the latch 72. When the sliding door 5 is moved in the closing direction by the powered sliding unit 7 and the latch 72 becomes in the half-latch position by the engagement with the striker 71, the sensor 112 detects the half-latch state of the door 5. When the sensor 112 detects the half-latch state, the closing unit 69 rotates the shaft 76 clockwise in FIG. 6, then the roller 79 moves along the guide groove 80 and comes into contact with a leg 81 of the latch 72 at the half-latch position to displace the latch 72 into the full-latch position. When the latch 72 comes to the full-latch position, the ratchet 73 engages with the full-latch step portion 75, so that the sliding door 5 is kept in the full-latch state.

A powered release unit 68 and an open handle 113 of the door 5 are operatively connected to the ratchet 73 so that the ratchet 73 can be released from the latch 72 by the power of the release unit 68 or the manual operation of the open handle 113.

At the front end of the sliding door 5, as shown in FIG. 5, is mounted an electric connector 70 which comes into contact with an electric connector 82 electrically connected to a battery 83 of the vehicle body 2 when the sliding door 5 is nearly closed. The release unit 68 and closing unit 69 are electrically connected to the battery 83 via the contact of the connector 70 with the connector 82. The connectors 70 and 82 are so arranged that they come into contact with each other just before the sliding door 5 becomes in the half-latch state, thereby the connectors 70 and 82 come surely into contact with each other at the half-latch state.

Figure 7:
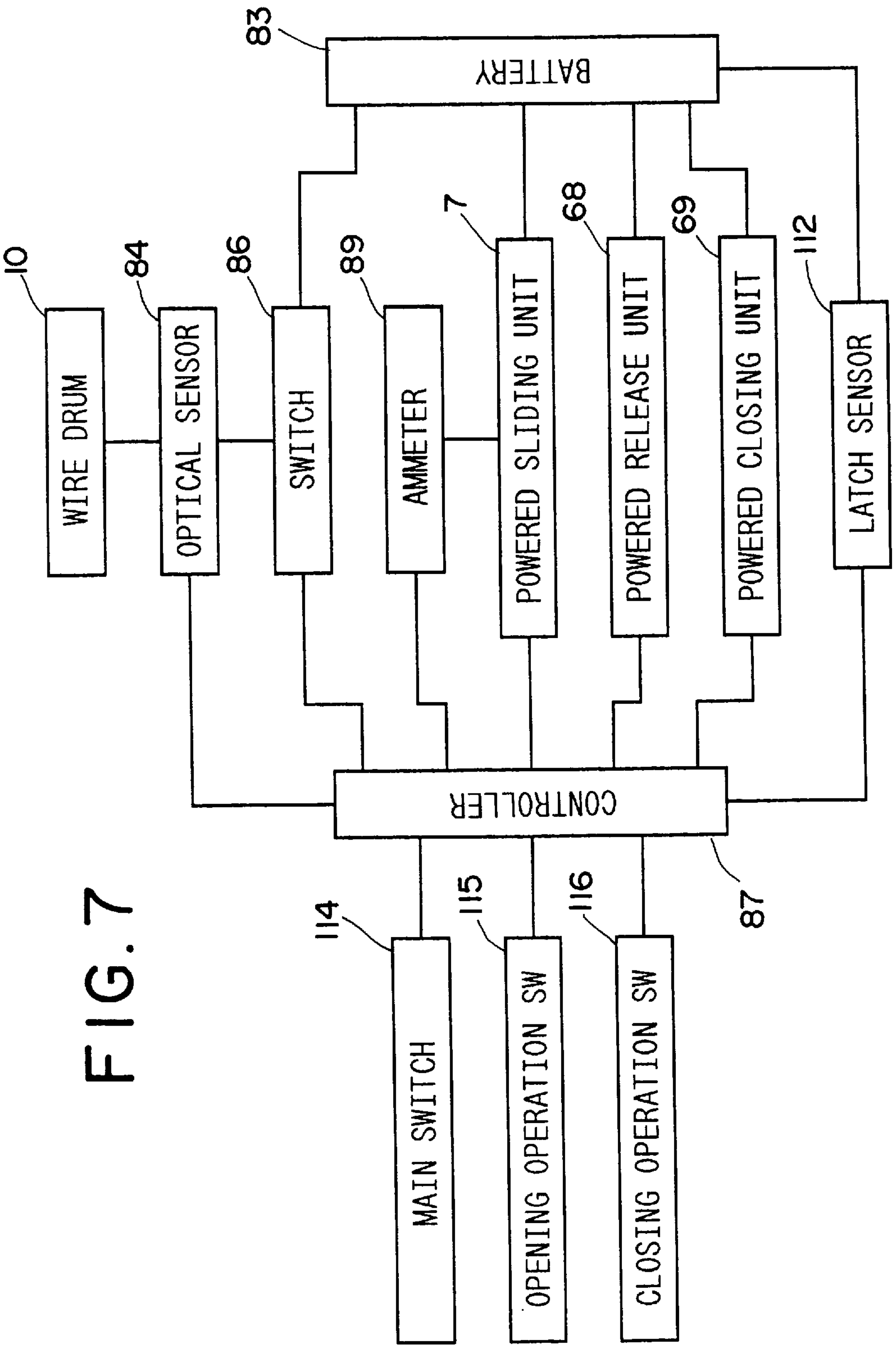
FIG. 7 is a block circuit diagram.

As shown in FIG. 2, the wire drum 10 is provided with a perforated flange 85. In the vicinity of the flange 85 is provided an optical sensor unit 84 which outputs pulse signal to a controller 87 (FIG. 7) when the perforated flange 85 is rotated. The controller 87 calculates the rotational amount of the perforated flange 85 (or drum 10) by adding up the number of the pulses and the rotational speed of the perforated flange 85 (or drum 10) from the intervals of the pulses. The controller 87 also calculates the rotational direction of the flange 85 (or drum 10) from the timing difference of the pulses. The rotational amount of the wire drum 10 is equal to the amount of the sliding movement of the door 5, the rotational speed of the drum 10 is equal to the sliding speed of the door 5, and the rotational direction of the drum 10 is equal to the sliding direction of the door 5.

The optical sensor 84 consumes a considerable amount of dark current (about 65 mA) even in a standby mode in which no pulse signal is outputted. When the sliding door 5 is in the half-latch state or in the full-latch state, therefore, the electric power supply to the optical sensor 84 is stopped by using a switch or relay 86. An ammeter 89 is connected to the motor 8 of the powered sliding unit 7. At desired positions of the vehicle body 2 are provided a main switch 114 for the controller 87, an opening operation switch 115, and a closing operation switch 116.

FIGS. 10 to 15 show a powered sliding unit 7*a* in accordance with the second embodiment of the present invention. In the second embodiment, the emergency release means of the coupling state of the clutch mechanism and the mechanism for adjusting the cable tension pressure are changed.

In the first embodiment, when the coupling state of the clutch mechanism 23 is intended to release in the door full-closed state or full-open state, the guide plate 32 should be rotated via the outer sleeve 44 and spring 46 by means of the operation ring 51. In this configuration, however, transmission efficiency of the external force is not high so that there is some difficulty in performing the releasing operation.

Figure 11:
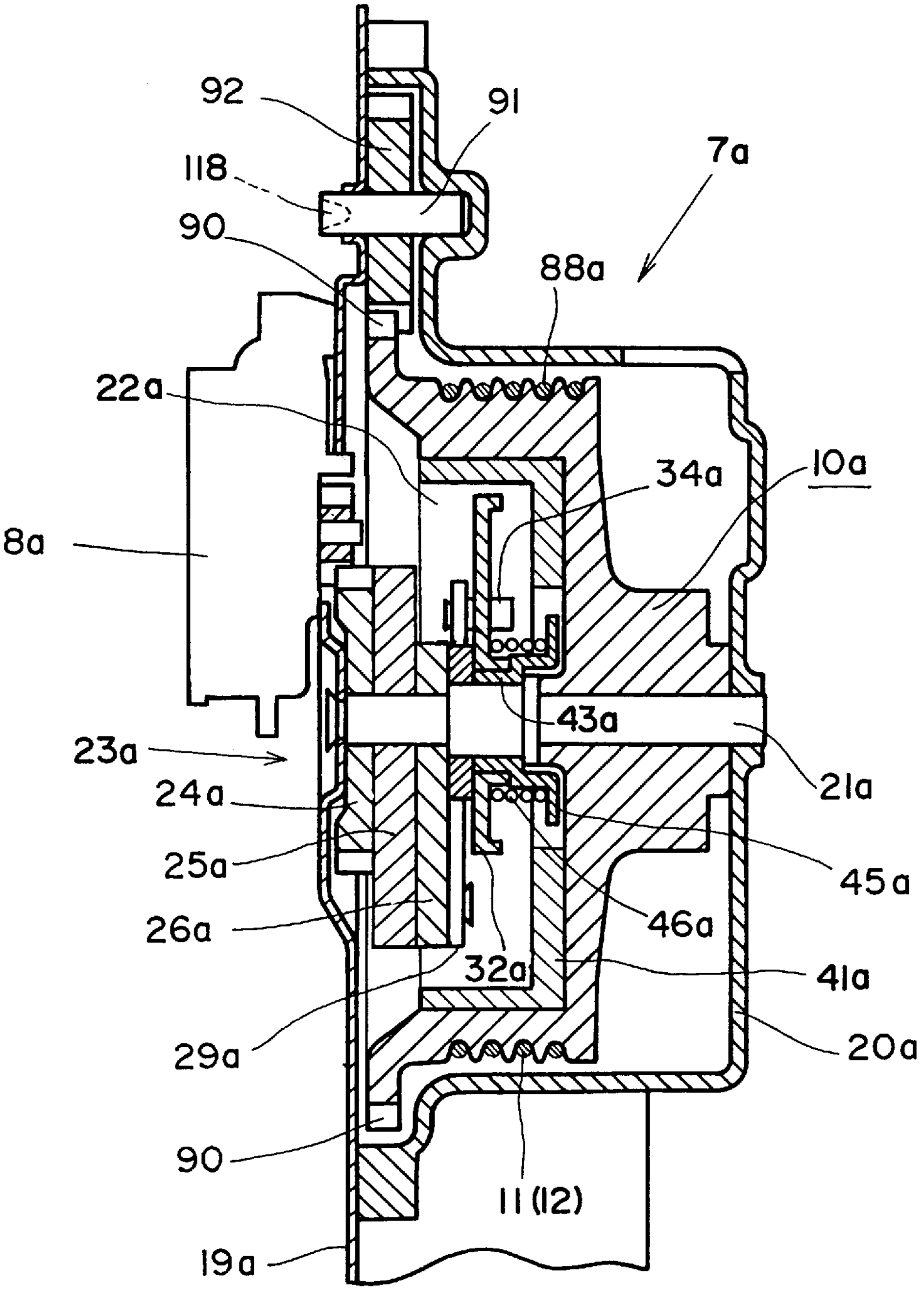
FIG. 11 is a sectional view of the powered sliding unit of the second embodiment.
Figure 12:
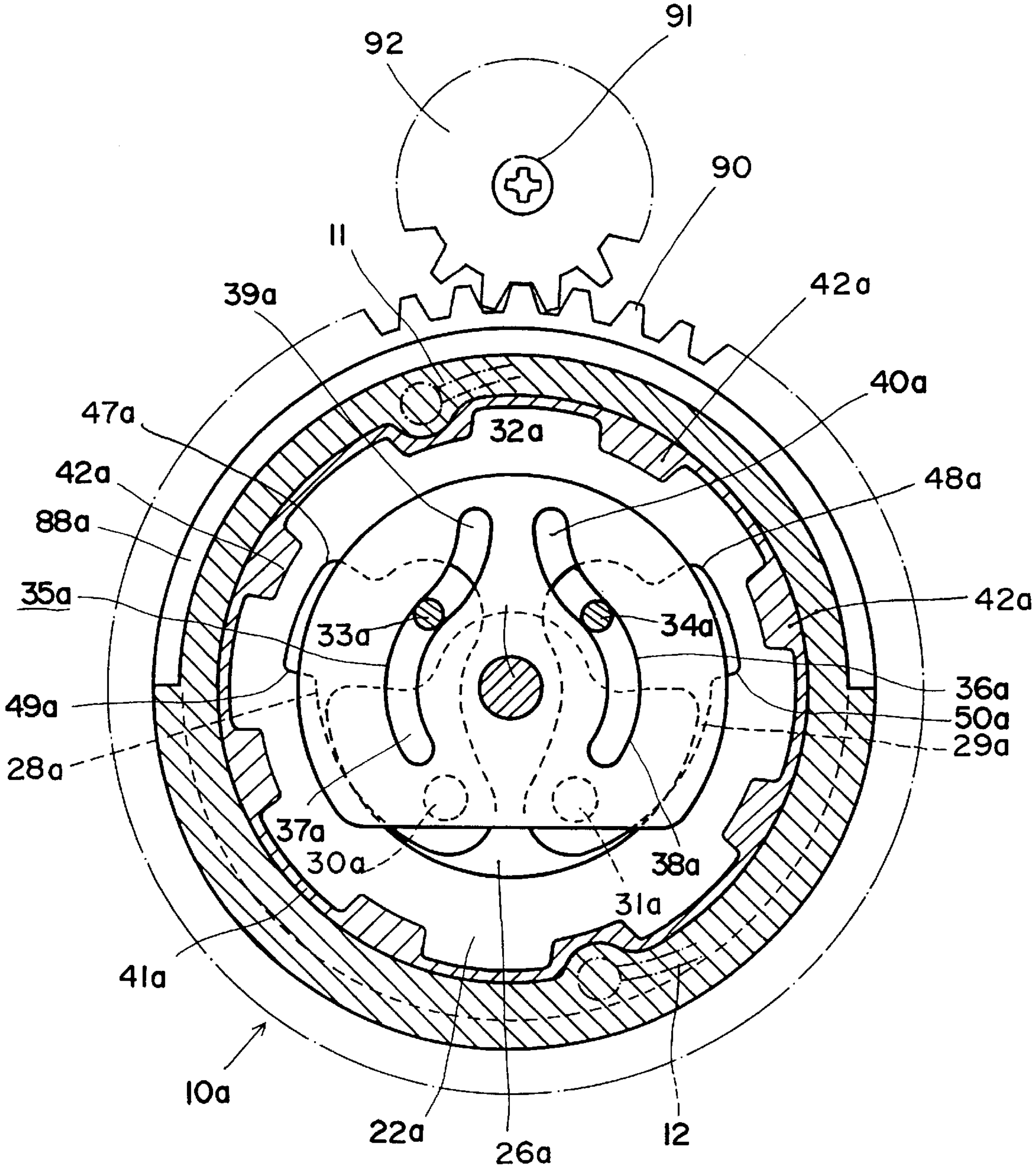
FIG. 12 is a sectional view of a wire drum of the second embodiment.

For the above reason, in the second embodiment, when the coupling state of the clutch mechanism 23*a* is intended to release in the full-closed state or full-open state, the wire drum 10*a* instead of the guide plate 32*a* should be rotated by external force. In the full-open state (or full-closed state), it is actually impossible to move the sliding door 5 in the door opening direction (or door closing direction). However, even in the full-open state (or full-closed state), it is fully possible to rotate the wire drum 10*a* in the opening direction (or closing direction) against the tension pressure of the cables 11, 12. This rotation of the wire drum 10*a* causes the clutch mechanism 23*a* to be released. Therefore, in the second embodiment as shown in FIGS. 11 and 12, the wire drum 10*a* is integrally formed with an annular toothed portion 90 with which a cancelling gear 92 is meshed. The gear 92 is mounted to plates 19*a,* 20*a* by means of an operation shaft 91, one end of which protrudes to the outside of the base plate 19*a.* The exposed end of the shaft 91 has an engaging portion with which a screw driver or like tool is engageable. When the wire drum 10*a* is rotated manually by the rotation of the shaft 91 through the gear 92, as already explained, the coupling state of the clutch mechanism 23*a* is released by the contact between the convex portion 42*a* of the drum 10*a* and the cancelling cam faces 49*a,* 50*a* of the swinging arms 28*a,* 29*a.* When the wire drum 10*a* is rotated by the gear 92, it is desirable to loosen the tension pressure of the cables. Also, when many convex portions 42*a* are formed on the wire drum 10*a,* the clutch mechanism 23*a* can be released by a small amount of rotation of the wire drum 10*a,* which facilitates the releasing operation.

Thus, in the second embodiment, the wire drum 10*a* can be rotated by the gear 92, so that a component corresponding to the outer sleeve 44 of the first embodiment is unnecessary. Therefore, one end of the spring 46*a* which gives the rotational resistance to the guide plate 32*a* is in contact with the flange 45*a* formed on the inner sleeve 43*a.*

Figure 10:
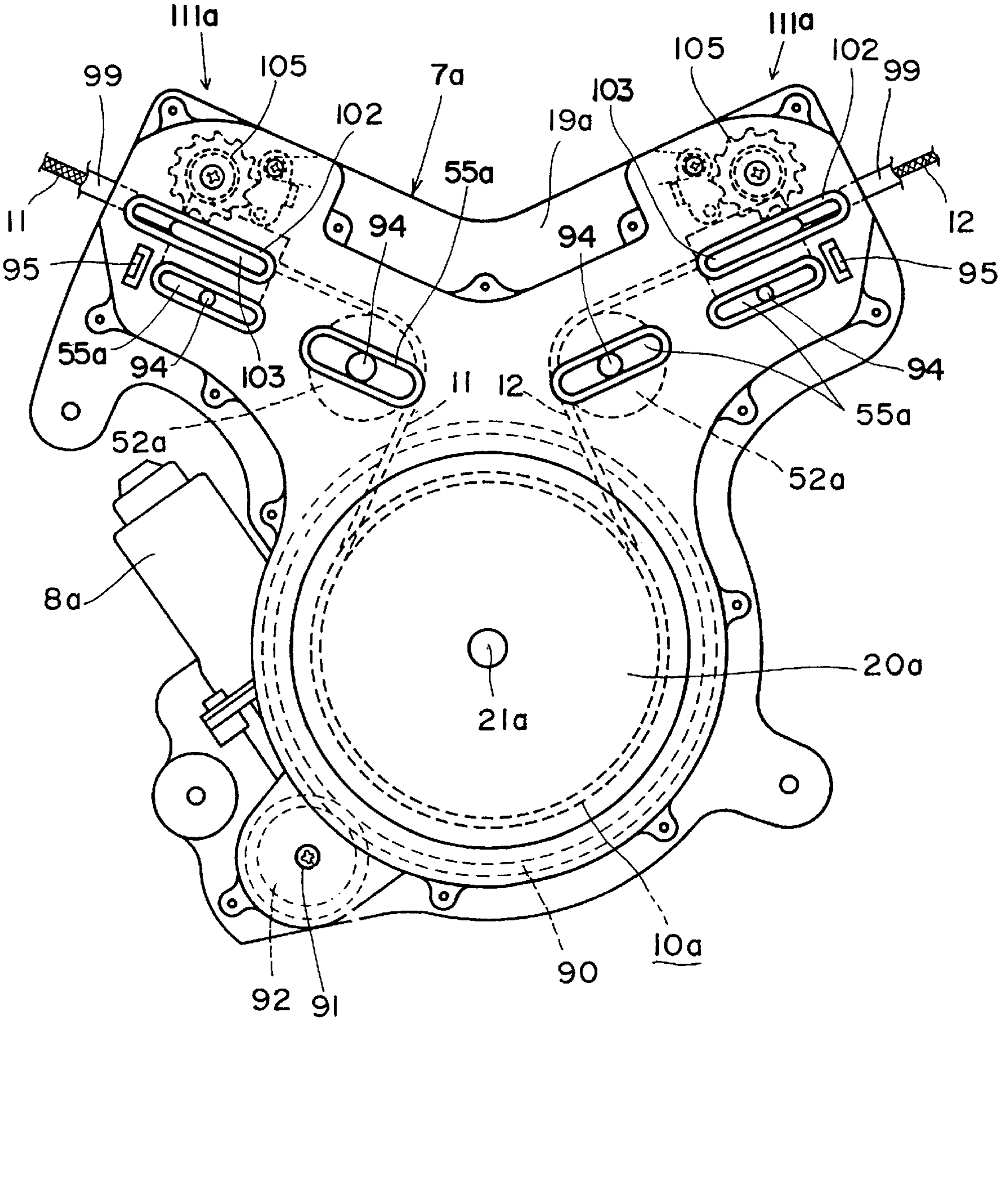
FIG. 10 is a side view of a powered sliding unit of a second embodiment according to the present invention.
Figure 13:
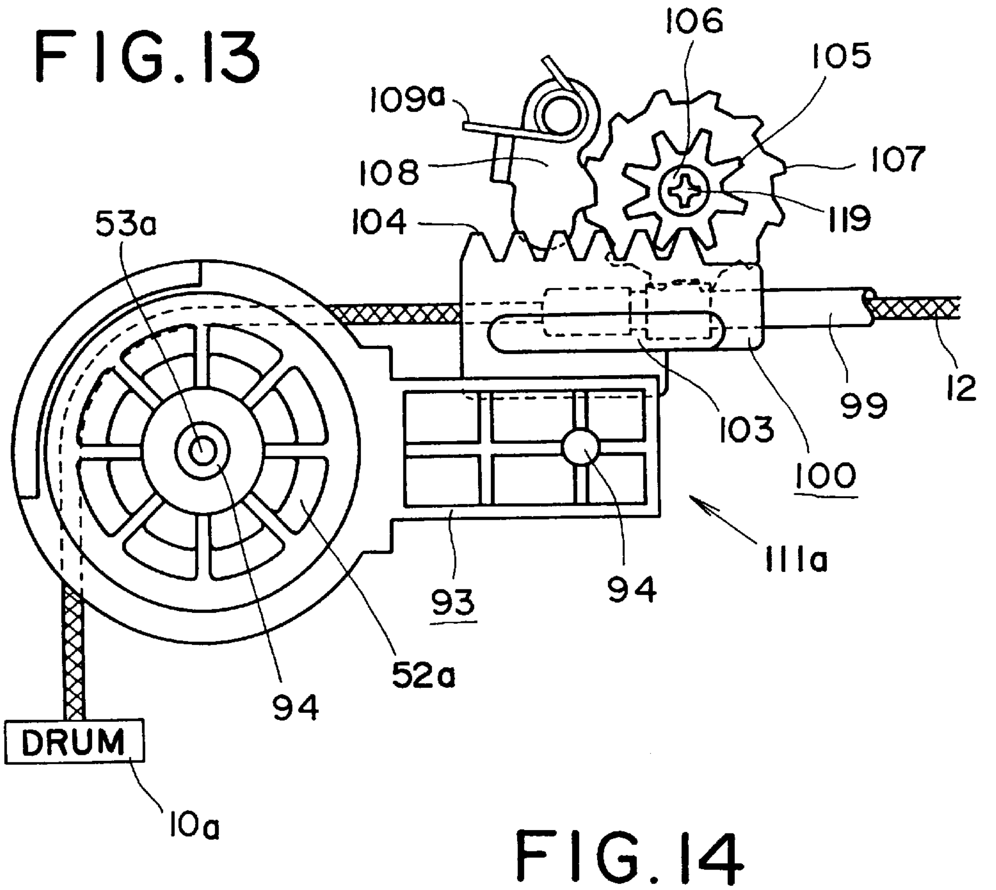
FIG. 13 is a front view of a tension adjusting mechanism of the second embodiment.
Figure 14:
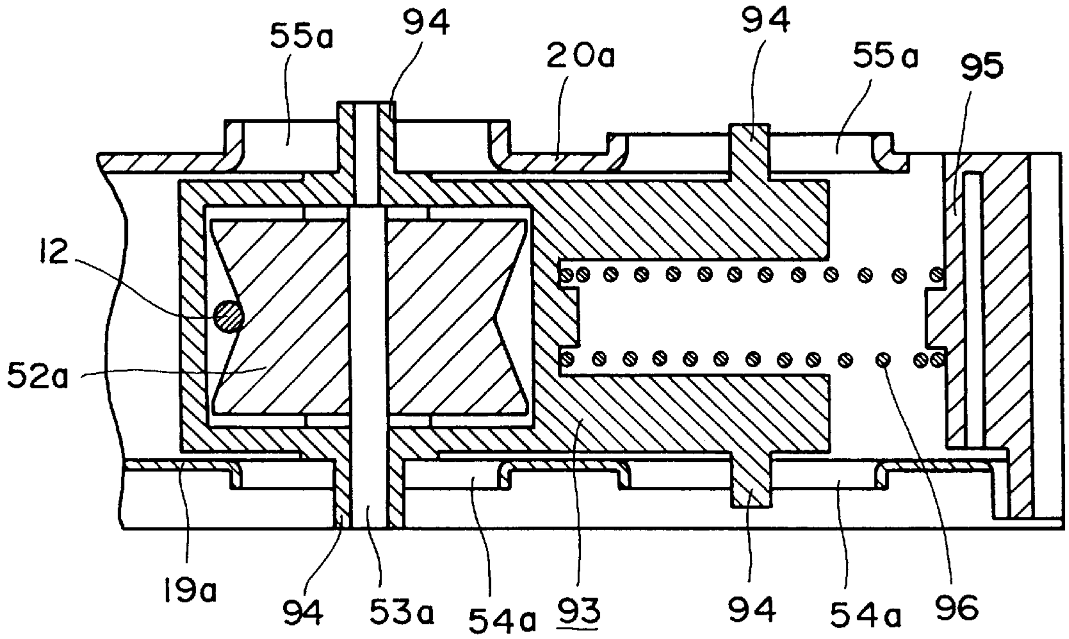
FIG. 14 is a sectional view of the tension adjusting mechanism of the second embodiment.

In the second embodiment, a tension adjusting mechanism 111*a* of the second embodiment is provided for each wire cable 11, 12 as shown in FIG. 10. The tension adjusting mechanism 111*a* has a sliding member 93 provided between the base plate 19*a* and the cover plate 20*a,* and a tension roller 52*a* is pivotally mounted inside the cylindrical portion of the sliding member 93 by means of a tension shaft 53*a,* as shown in FIGS. 13 and 14. The sliding member 93 is provided with four engagement pins 94 which engage slidably with elongated holes 54*a,* 55*a* formed in the plates 19*a* , 20*a,* respectively. A tension spring 96 is provided between the sliding member 93 and a stationary member 95 fixed between the plates 19*a* , 20*a.* As shown in FIG. 10, each of wire cables 11, 12 is bent at substantially right angles at the tension roller 52*a.* The tension roller 52*a* is so configured as to slide in parallel with one side of the wire cable 11, 12 bent at right angles.

Figure 15:
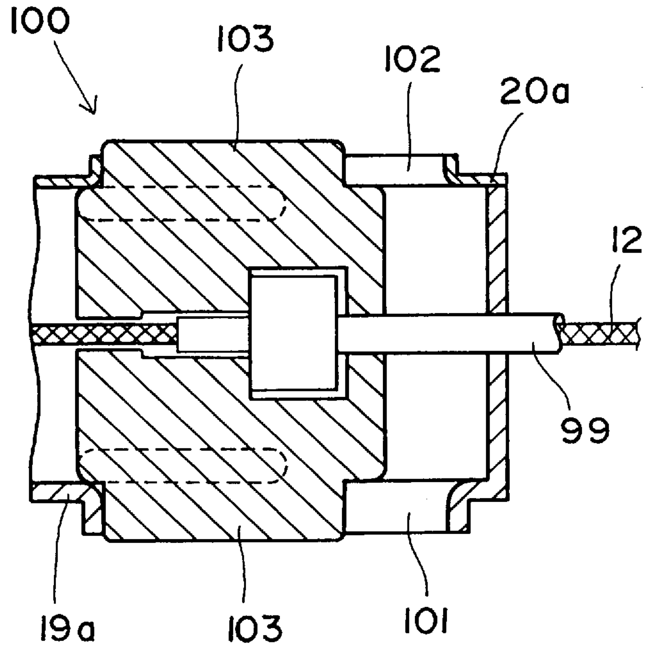
FIG. 15 is a sectional view of a sheath holder.

The outer periphery of the front cable 11 between the powered sliding unit 7*a* and the front cable hole 97 of the side panel 1 and the outer periphery of the rear cable 12 between the sliding unit 7*a* and the rear cable hole 98 of the side panel 1 are covered with wire sheaths 99. The wire sheath 99 is formed of a material which is flexible but does not expand and contract in the longitudinal direction thereof. The use of the wire sheath 99 eliminates the need for almost all of the pulleys 17. One ends of the wire sheaths 99 are connected to sheath holders 100 of the tension adjusting mechanisms 111*a* as shown in FIGS. 13 and 15. The other ends of the wire sheaths 99 are connected to sheath holders (not shown) provided in the vicinity of the cable holes 97, 98. The sheath holder 100 is provided with two protrusions 103 which engage slidably with elongated holes 101, 102 formed in the plates 19*a,* 20*a,* respectively. The sheath holder 100 and the sliding member are slidable independently with each other. The sheath holder 100 has a rack 104 with which a pinion gear 105 is meshed. The pinion gear 105 is provided between the plates 19*a,* 20*a* by means of a shaft 106. At the top of the shaft 106 is formed an engaging portion 119 with which a tool such as a screw driver is engageable. When the shaft 106 is rotated by the tool, the pinion gear 105 is rotated to slide the sheath holder 100 in parallel with the tension roller 52*a.* The pinion gear 105 is provided with a ratchet wheel 107 with which a pawl lever 108 is engaged by resilient force of a spring 109*a.* The pawl lever 108 permits the pinion gear 105 to rotate in a one-way direction.

The length of the wire sheath 99 is always kept in constant because the wire sheath 99 is made of a material which does not expand and contract in the longitudinal direction thereof. Therefore, the length of the front cable 11 positioned between the front sheath holder 100 and the front cable hole 97 and the length of the rear cable 12 positioned between the rear sheath holder 100 and the rear cable hole 98 are also kept constant. Thereupon, if the sheath holder 100 is slid in the direction apart from the wire drum 10*a,* i.e. a rightward direction in FIG. 13, the distance between the sheath holder 100 and the wire drum 10*a* increases, so that the tension of the wire cables 11, 12 increases accordingly. Contrarily, when the sheath holder 100 is brought close to the wire drum 10*a,* the wire cables 11, 12 are loosened. In assembling the powered sliding unit 7*a,* the sheath holders 100 are brought closest to the wire drum 10*a* to fully loosen the cables in order to perform the assembly work easily. Subsequently, the sheath holder 100 is slid in the tension direction to make the initial adjustment of wire tension. After the initial tension adjustment is finished by means of the sheath holders 100, the slack of the cables is absorbed by the tension roller 52*a* which is moved by the elastic force of the tension spring 96. Also, when the wire drum 10*a* is rotated by the cancelling gear 92, the pawl lever 108 is released from the ratchet wheel 107 against the elastic force of the spring 109*a* to make the wire tension pressure minimum.

Next, the details of a control operation of the controller 87 will be described hereinbelow by referring a plurality of flowcharts of FIGS. 16A, 16B to 20. In these flowcharts, the following designations listed below will be used for simplicity of drawings.

| DESIGNATION | MEANING |
|---|---|
| O/D | Opening Direction |
| C/D | Closing Direction |
| R/D | Reverse Direction |
| S/R | Subroutine |
| P/A | Predetermined Amount |
| F/O | Full-Open |

Figure 16A:
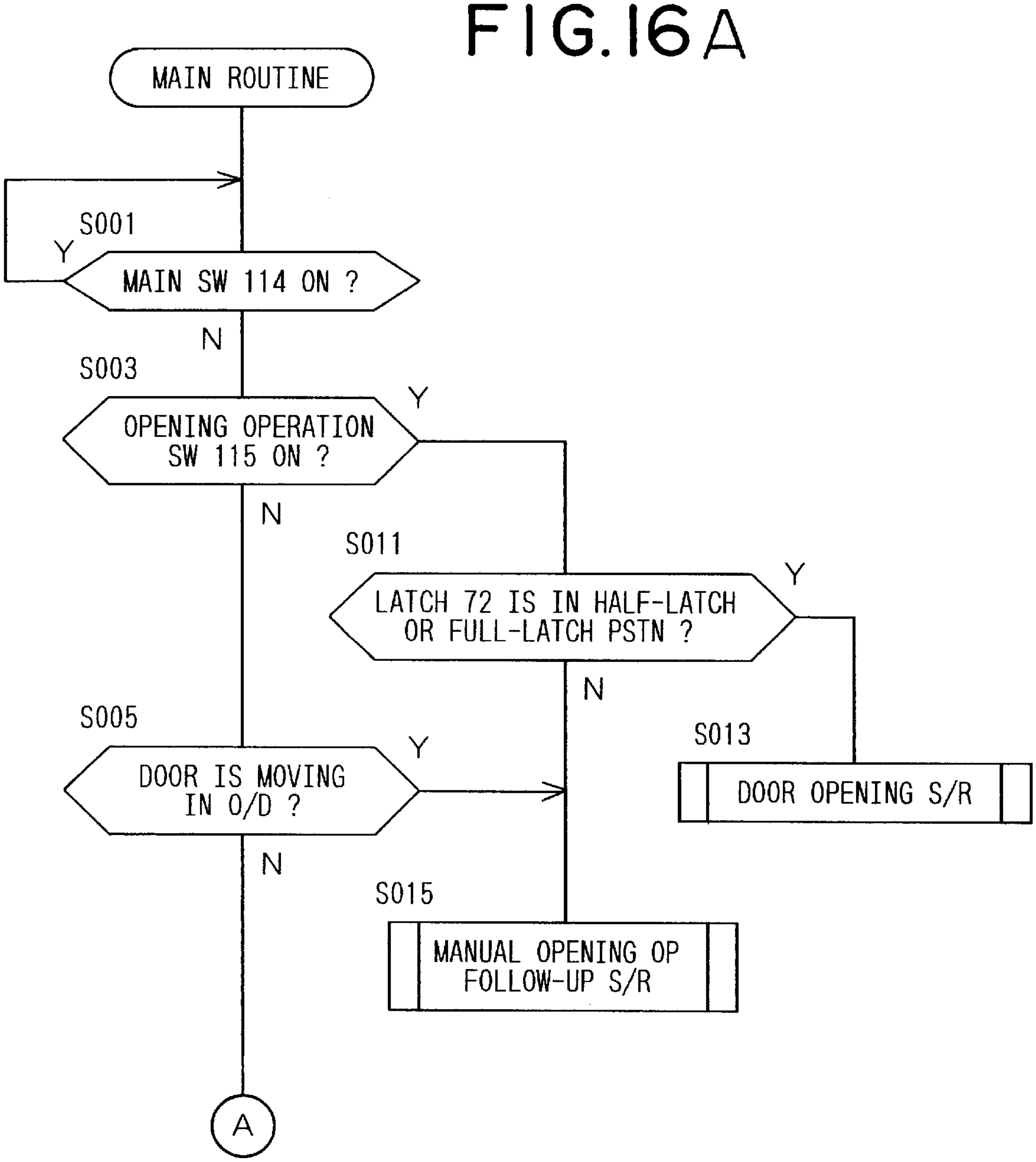
FIGS. 16A and 16B are flowcharts of a main routine to be executed by a controller.
Figure 16B:
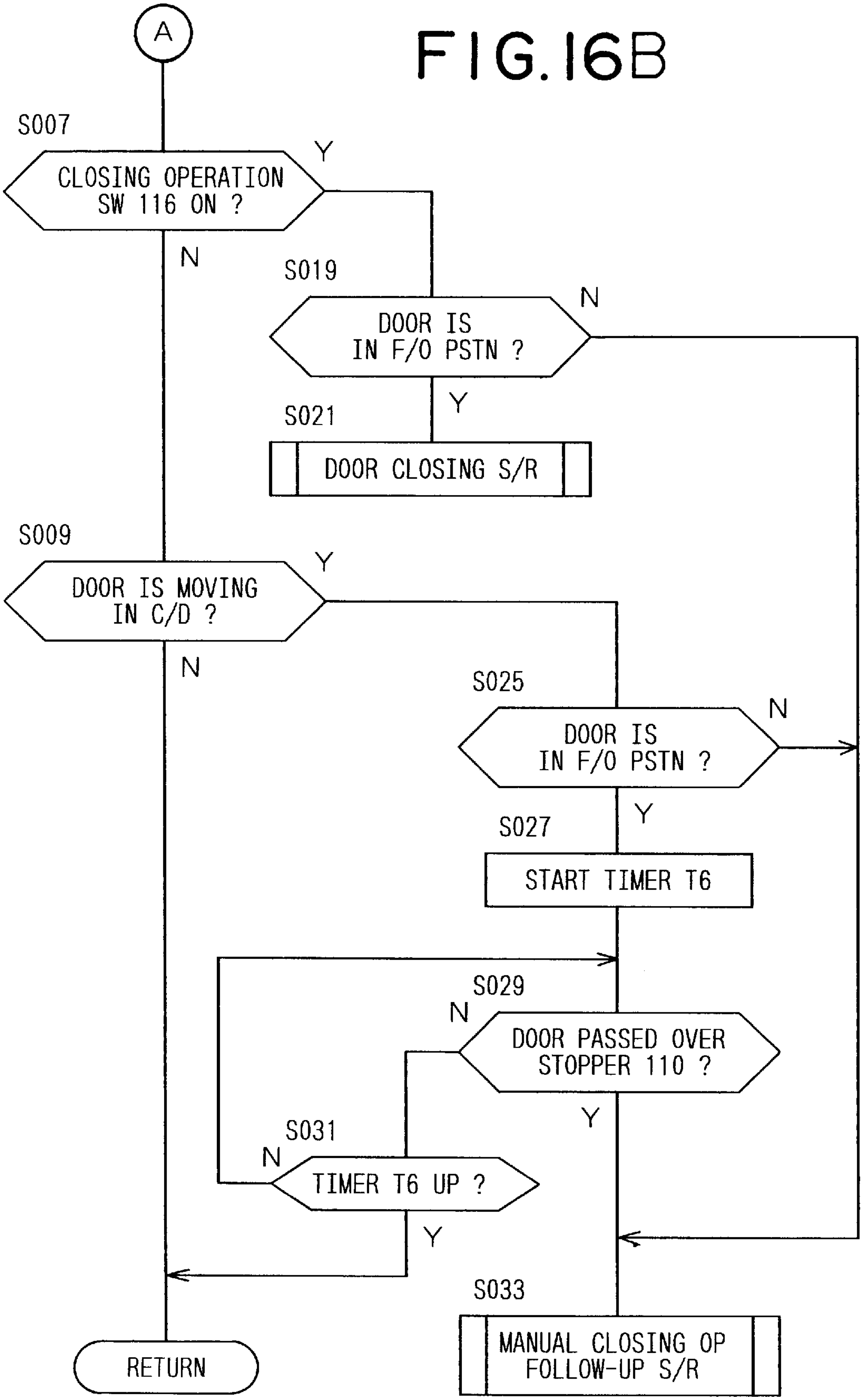
Figure 17A:
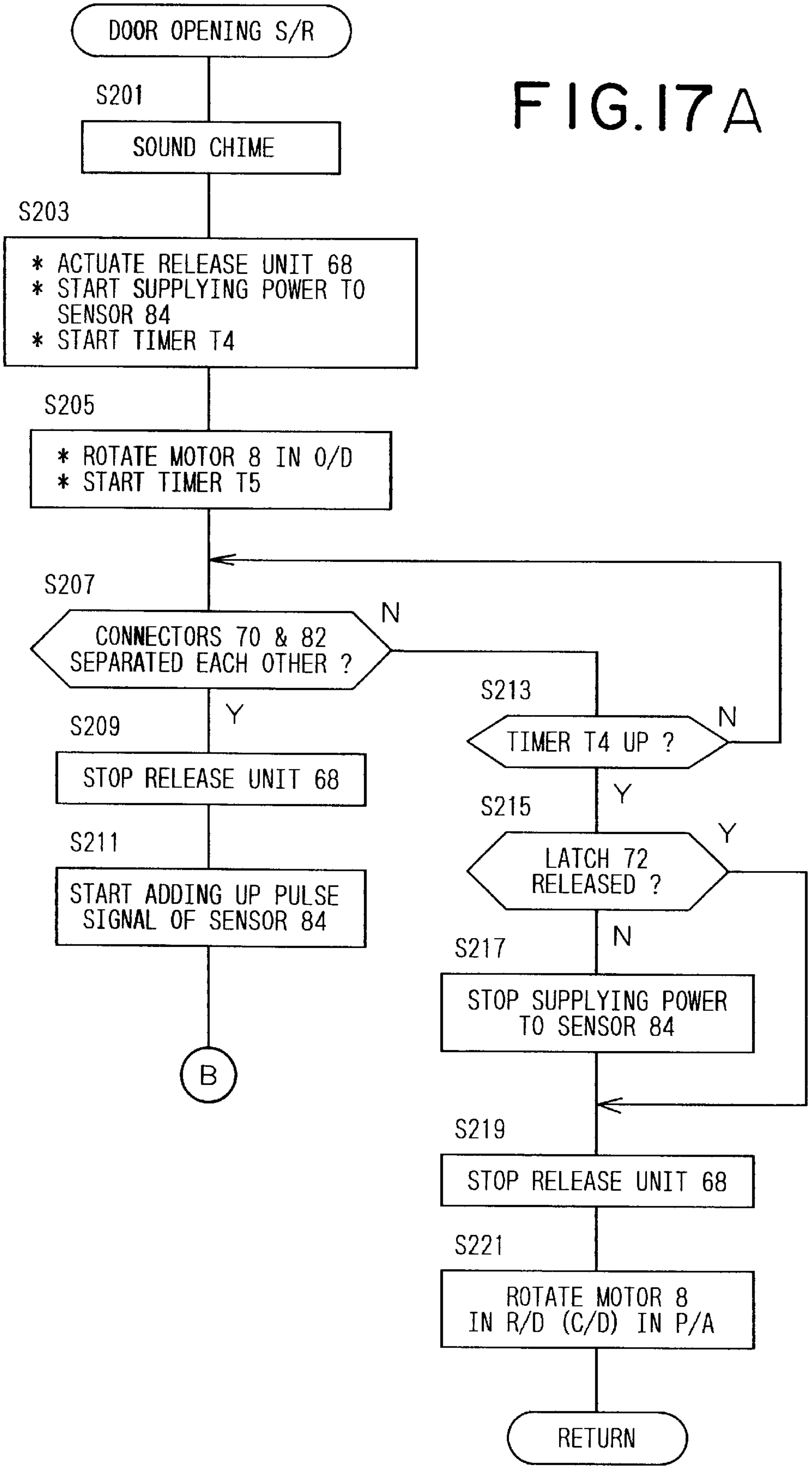
FIG. 17A and 17B are flowcharts of a door opening subroutine.
Figure 17B:
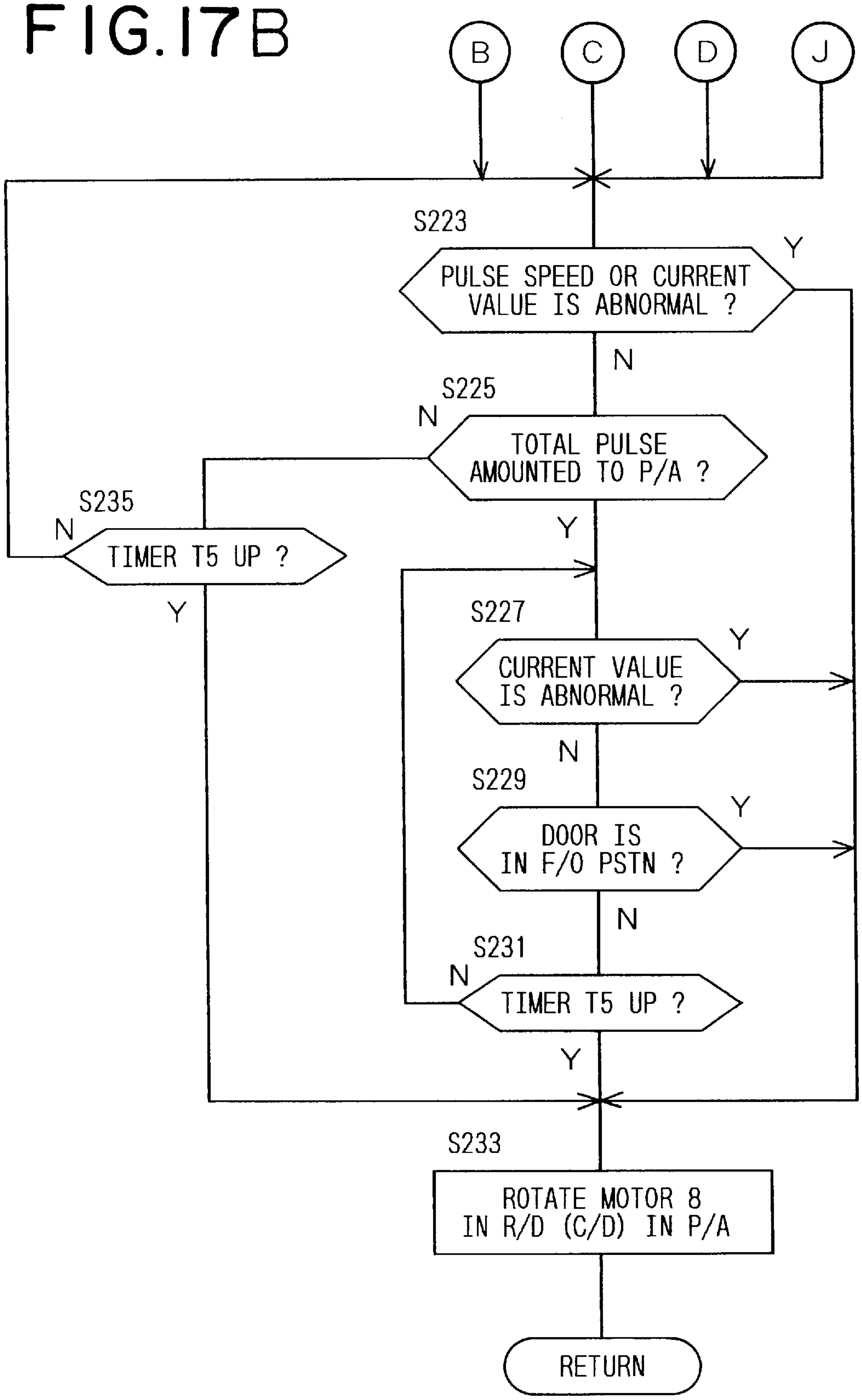

FIGS. 16A and 16B show a main routine to be carried out by the controller 87 when the main switch 114 provided at a desired position of the vehicle body 2 is ON. In the main routine, first it is checked in step S003 whether or not the opening operation switch 115 is ON, secondly it is checked in step S005 whether or not the sliding door 5 is moving in the door opening direction by monitoring the pulse signal outputted from the optical sensor 84, thirdly it is checked in step S007 whether or not the closing operation switch 116 is ON, and fourthly it is checked whether or not the sliding door 5 is moving in the closing direction by monitoring the pulse signal outputted from the optical sensor 84.

Door Opening Subroutine

In step S003 of the main routine, when it is detected that the opening operation switch 115 is ON, the position of the latch 72 is checked in step S011. If the latch 72 is in the half-latch position or in the full-latch position, the control of the controller 87 is passed to the "Door Opening Subroutine" of FIGS. 17A and 17B.

In the door opening subroutine, a chime is first sounded (S201), and the ratchet 73 is released from the latch 72 by power of the powered release unit 68 which is electrically connected to the battery 83 through the contact between the connector 70 of the door 5 and the connector 82 of the vehicle body 2. Power of the battery 83 is then supplied to the optical sensor 84 through the switch 86, and a timer T4 is started (S203). Subsequently, the motor 8 of the powered sliding unit 7 is rotated in the opening direction, and a timer T5 is started (S205).

When the motor 8 is rotated in the opening direction, the rotary disk 26 is rotated clockwise in FIG. 3, so that the swinging arms 28, 29 connected to the rotary disk 26 with the pins 30, 31 are also rotated clockwise. Then, the swinging arm 28 is swung in a direction far from the drum shaft 21 about the pin 30 as a center by the sliding engagement between the pin 33 and the extension slot 39, so that the clutch claw 47 of the swinging arm 28 moves toward and engages with one of the convex portion 42 of the wire drum 10. Simultaneously, the sliding pin 34 of the swinging arm 29 moves within the arcuate slot 38. However, the clutch claw 48 of the swinging arm 29 does not leave the drum shaft 21, since the arcuate slot 38 is formed in an arc having a constant radius measured from the drum shaft 21.

When the clutch claw 47 is engaged with the convex portion 42, the clutch mechanism 23 becomes in the coupling state, the rotational power of the motor 8 is then transmitted to the wire drum 10 to rotate it clockwise in FIG. 8, thereby the door 5 is slid in the opening direction.

When the door 5 is slid in the opening direction normally, the connector 70 of the door 5 separates from the connector 82 of the vehicle body 2 in an instant (S207). However, if the separation of the connector 70 from the connector 82 is not detected within the time determined by the timer T4 (S213), it is suspected that the failure of the powered release unit 68, or the failure of the powered sliding unit 7, or the freezing between the door 5 and the vehicle body 2 may have occurred. If such abnormality occurs, the position of the latch 72 is checked in step S215. When the latch 72 is still engaged with the striker 71, the power supply to the optical sensor 84 is stopped by turning off the switch 86 (S217), and then the power supply to the powered release unit 68 is also stopped (S219). Subsequently, the motor 8 is rotated in the reverse direction, i.e. in the closing direction for a predetermined time or by a predetermined amount (S221), and then the control of the controller 87 is returned to the main routine.

In step S215, if the latch 72 has already been released from the striker 71, the power supply to the optical sensor 84 is not stopped. The power supply to the optical sensor 84 is stopped only when the latch 72 is in the half-latch position or in the full-latch position. When the sliding door 5 is in open position, power of the battery 83 is always supplied to the optical sensor 84 so that the position and movement of the sliding door 5 can be detected by the optical sensor 84. Since engine or dynamo of the vehicle body 2 is often stopped when the door 5 is closed, if power is supplied to the optical sensor 84 in the door closed state, the battery 83 runs down remarkably.

The purpose of rotating the motor 8, in step S221, in the reverse direction by the predetermined amount is that the clutch mechanism 23 is returned to the uncoupling state shown in FIG. 3 from the coupling state shown in FIG. 8. When the motor 8 is rotated in the reverse direction in the coupling state, the rotary disk 26 is rotated counterclockwise in FIG. 8, the swinging arm 28 is then swung about the pin 30 as a center in a direction near to the drum shaft 21 by the sliding engagement between the pin 33 and the extension slot 39. When the predetermined amount of the reverse rotation of the motor 8 is completed, the clutch claw 47 of the swinging arm 28 is released from the convex portion 42 and the coupling state of the clutch mechanism 23 is released. As a result, the door 5 can be slid freely by hand.

Returning to the step S207, when the connectors 70 and 82 are separated from each other due to the normal movement of the door 5 in the opening direction, the powered release unit 68 is stopped (S209), and then the adding-up of number of the pulses of the pulse signal outputted from the optical sensor 84 is started (S211). The amount of rotation of the wire drum 10, i.e. the amount of sliding movement of the door 5 can be determined from the total amount of the pulses. The adding-up of the pulses is started when the connector 70 is separated from the connector 82. Thereupon, the pulses of unstable pulse signal just after the start of power supply to the optical sensor 84 can be eliminated, so that the position of the door 5 can be monitored accurately.

While the door 5 is sliding in the opening direction, the controller 87 monitors the intervals of the pulses as a pulse speed, and also monitors the current value of the motor 8 through the ammeter 89 (S223). The rotational speed of the wire drum 10, i.e. the sliding speed of the door 5 is determined from the pulse speed, and the load of the motor 8 is determined from the current value. When the sliding speed of the door 5 is lower than the preset speed, or when the changing rate of the sliding speed is larger than the preset rate, or when the current value of the motor 8 is larger than the preset value, it is suspected that the door 5 is subjected to unexpected resistance. Therefore, the motor 8 is rotated in the reverse direction for the predetermined time to return the clutch mechanism 23 to the uncoupling state in step S233, and then the control of the controller 87 is returned to the main routine. By monitoring the sliding movement of the door 5 with the optical sensor, the abnormal sliding movement can be detected quickly and accurately. Further, such advantages are not influenced by voltage fluctuation of the battery.

If the sliding movement of the door 5 in the opening direction is continued normally, the total amount of the pulses reaches a predetermined amount (S225) before the timer T5 expires (S235). Thereby, the sliding door 5 is considered to be positioned just before the full-open stopper 110. Then, the abnormality monitoring using the pulse speed is suspended, and only the abnormality monitoring using the current value of the motor 8 is carried out (S227). When the sliding door 5 further slides in the opening direction by means of power of the motor 8, the sliding door 5 gets over the full-open stopper 110 and comes into contact with a mechanical end portion of the vehicle body 2, being held at the full-open position. The full-open position of the sliding door 5 can be detected by the total amount of the pulses or the change of the current value of the motor 8 (S229). When the sliding door 5 comes to the full-open position, the motor 8 is rotated in the reverse direction by the predetermined amount to return the clutch mechanism 23 to the uncoupling state, and then the control is returned to the main routine.

The total amount of the pulses is not reset even when the door opening operation is completed. The reset of the total is performed when the connector 70 of the door 5 comes into contact with the connector 82 of the vehicle body 2 by closing the door (see step S415 of "Door Closing Subroutine"). The monitoring of the sliding speed of the door 5 using the pulse speed is carried out only while the door 5 is being positioned in a section in which the slide resistance is constant. That is, when the connector 70 and connector 82 make contact with each other and when the door 5 is in contact with the full-open stopper 110, the abnormality monitoring using the pulse speed is not carried out.

The door opening operation in the case where the opening operation switch 115 is ON is as described above. When the open handle 113 of the door 5 is operated in place of the opening operation switch 115 as well, the sliding door can be opened by the powered sliding unit 7 by following the opening operation of the flowcharts shown in FIGS. 17A and 17B. In this case, the ratchet 73 should be manually released from the latch 72 by the operation of the open handle 113, so that it is unnecessary to actuate the powered release unit 68.

Returning to step S011 of the main routine, if the latch 72 is released from the striker 71, the opening operation switch 115 is considered to be activated while the door 5 is being at a halfway position. In this case, the control of the controller 87 is passed to the "Manual Opening Operation Follow-up Subroutine".

Door Closing Subroutine

When it is detected that the closing operation switch 116 is ON, it is checked whether or not the sliding door 5 is at the full-open position in step S019 of the main routine. If the door 5 is at the full-open position, the control of the controller 87 is passed to the "Door Closing Subroutine" of FIGS. 19A, 19B and 19C. At this time, since the latch 72 is released from the striker 71, the optical sensor 84 is continuously supplied with power of the battery 83. Also, the total amount of the pulses of the pulse signal added up by the door opening is stored in the controller 87.

In the door closing subroutine, the chime is first sounded (S401), and then the motor 8 of the powered sliding unit 7 is rotated in the closing direction, and timers T1 and T2 are started (S403). The rotary disk 26 is then rotated counterclockwise in FIG. 3, so that the swinging arms 28, 29 connected to the rotary disk 26 with the pins 30, 31 are also rotated counterclockwise, and the swinging arm 29 is swung in a direction far from the drum shaft 21 about the pin 31 as a center by the sliding engagement between the pin 34 and the extension slot 40. Thereby, the clutch claw 48 of the swinging arm 29 moves toward and engages with one of the convex portion 42 of the wire drum 10. Simultaneously, the pin 33 of the swinging arm 28 moves within the arcuate slot 37. The clutch claw 47 of the swinging arm 28, however, does not leave the drum shaft 21, since the arcuate slot 37 is formed in an arc having a constant radius measured from the drum shaft 21.

When the clutch claw 48 is engaged with the convex portion 42, the clutch mechanism 23 becomes in the coupling state, the rotational power of the motor 8 is then transmitted to the wire drum 10 to rotate it in the closing direction, whereby the sliding door 5 is slid in the closing direction. When the door 5 slides in the closing direction, the optical sensor 84 outputs the pulse signal to the controller 87. At this time, number of pulses of the signal is subtracted from the total amount of the pulses because the door is sliding in the closing direction.

When the door 5 is slid normally in the closing direction by rotation of the wire drum 10, the door 5 gets over the full-open stopper 110 (S405) before the timer T1 expires (S407). The getting over of the stopper 110 can be confirmed by the position of the sliding door 5 calculated from the total amount of the pulses. If the getting over of the stopper cannot be detected within the time of the timer T1 (S407), the motor 8 is rotated in the reverse direction by the predetermined amount to return the clutch mechanism to the uncoupling state (S431), and the control of the controller 87 is returned to the main routine.

After the door 5 gets over the stopper 110 (S405), the sliding speed of the door 5 determined from the pulse speed and the current value of the motor 8 are monitored (S409). If any abnormality is found, it is suspected that a hand or the like of the passenger may have been caught between the door 5 and the vehicle body 2, and then an alarm is given from the time when a timer T3 is started (S433) to the time when the timer T3 expires (S439) or to the time when the opening operation switch 115 is turned ON (S437). Thereafter, the motor 8 of the powered sliding unit 7 is rotated in the opening direction, the timer T5 is started (S443), and then the control is passed to the step S223 of the "Door Opening Subroutine". Thereby, the sliding door 5 is opened by power as already described. Therefore, even if the body of passenger is caught between the door and the vehicle body, the damage to the passenger is minimized.

If abnormality is not found in step S409, before the timer T2 expires in step S413, the connector 70 of the door 5 comes into contact with the connector 82 of the vehicle body 2 (S411). By this contact, the total amount of the pulses is reset (S415), thereby the monitoring of the position of the door 5 using the pulse signal is finished. Also, the monitoring of the sliding speed of the door using the pulse speed is finished due to the change of slide resistance of the door. Incidentally, the powered closing unit 69 provided within the door is electrically connected to the battery 83 of the vehicle body through the contact between the connectors 70 and 82. After the contact between the connectors, the sliding door 5 is further slid in the closing direction by power of the sliding unit 7 while the sliding movement of the door 5 is monitored by using the current value of the motor 8 (S417). Due to the further movement of the door 5, before the timer T2 expires (S421), the latch 72 of the latch unit 67 comes into contact with the striker 71 and becomes in the half-latch position (S419).

When the latch 72 comes to the half-latch position, the power supply to the optical sensor 84 is stopped (S423), and the motor 8 is rotated in the reverse direction, i.e. in the opening direction by the predetermined amount (S425) to return the clutch mechanism 23 to the uncoupling state. At this time, even if the motor 8 is stopped, the latch 72 becomes into the full-latch position over the half-latch position in rare occasions due to the inertial movement of the door 5. And, if the full-latch position of the latch 72 is detected in step S427, the subsequent control of closing the door completely is unnecessary, so that the control of the controller 87 is returned to the main routine.

If the full-latch position of the latch 72 is not detected in step S427, the powered closing unit 69 is actuated in step

S429 to rotate the shaft 76 of the latch unit 67 clockwise in FIG. 6. Then, the roller 79 moves along the guide groove 80, and comes into contact with the leg 81 of the latch 72 at the half-latch position to rotate the latch 72 toward the full-latch position. When the latch 72 comes to the full-latch position, the powered closing unit 69 is stopped, and the control is returned to the main routine.

In step S417, If abnormality of current value is detected, the control of the controller 87 is passed to step S307 of the "Manual Opening Operation Follow-up Subroutine" to open the door 5 by power. If the door 5 is not in the full-open position in step S019 of the main routine, the control of the controller 87 is passed to the "Manual Closing Operation Follow-up Subroutine".

Manual Opening Operation Follow-up Subroutine

While the sliding door 5 is being in any state other than the half-latch state and full-latch state, the optical sensor 84 is always supplied with power of the battery 83. Therefore, in the case where the sliding door 5 is in any state other than the half-latch and full-latch states, if the door 5 is slid manually, the pulse signal from the optical sensor 84 is sent to the controller 87, whereby the controller 87 can detect the manual movement of the door 5, and also calculates the movement direction of the door 5. If the sliding movement of the door 5 in the opening direction is detected in step S005 of the main routine, the control of the controller 87 is passed to the "Manual Opening Operation Follow-up Subroutine" of FIG. 18. And when the latch 72 is released from the striker 71 in step S011 of the main routine, the control is also passed to the "Manual Opening Operation Follow-up Subroutine".

In the manual opening operation follow-up subroutine, the chime is first sounded (S301), and then it is checked whether or not the connectors 70 and 82 make contact with each other (S303). If they are not in contact with each other, the motor 8 of the powered sliding unit 7 is rotated in the opening direction, and the timer T5 is started (S305). Thereby, the door 5 is slid in the opening direction. Then, the control of the controller 87 is passed to the step S223 of the "Door Opening Subroutine", and the sliding door 5 is opened by power as already described above.

When the connector 70 is in contact with the connector 82 in step S303, the motor 8 of the powered sliding unit 7 is rotated in the opening direction, and the timers T4 and T5 are started (S307). If the door 5 slides normally in the opening direction, before the timer T4 expires (S311), the connector 70 separates from the connector 82 (S309). At this time, the total mount of the pulses of the pulse signal is reset due to the contact between the connectors 70 and 82. Therefore, if the connectors are separated from each other, the adding-up of the number of the pulses is started in step S310, and then the control is passed to the step S223 of the "Door Opening Subroutine". Thereby, the sliding door 5 is opened by power as already described.

When the timer T4 expires in step S311, meaning the occurrence of abnormality, the motor 8 is rotated in the reverse direction by the predetermined amount to return the clutch mechanism 23 to the uncoupling state (S313). Then, the control is returned to the main routine.

Incidentally, in order to slide the door in the half-latch or full-latch state, an action for releasing the ratchet 73 from the latch 72 must be taken. For this reason, in the above manual opening operation follow-up subroutine, the case where the door 5 is in the half-latch and full-latch states is excluded.

Manual Closing Operation Follow-up Subroutine

While the sliding door 5 is being in any state other than the half-latch state and full-latch state, the optical sensor 84 is always supplied with power of the battery 83. Therefore, in the case where the sliding door 5 is in any state other than the half-latch and full-latch states, if the door 5 is slid manually, the pulse signal from the optical sensor 84 is sent to the controller 87, whereby the controller 87 can detect the manual movement of the door 5, and also calculates the movement direction of the door 5.

Figure 18:
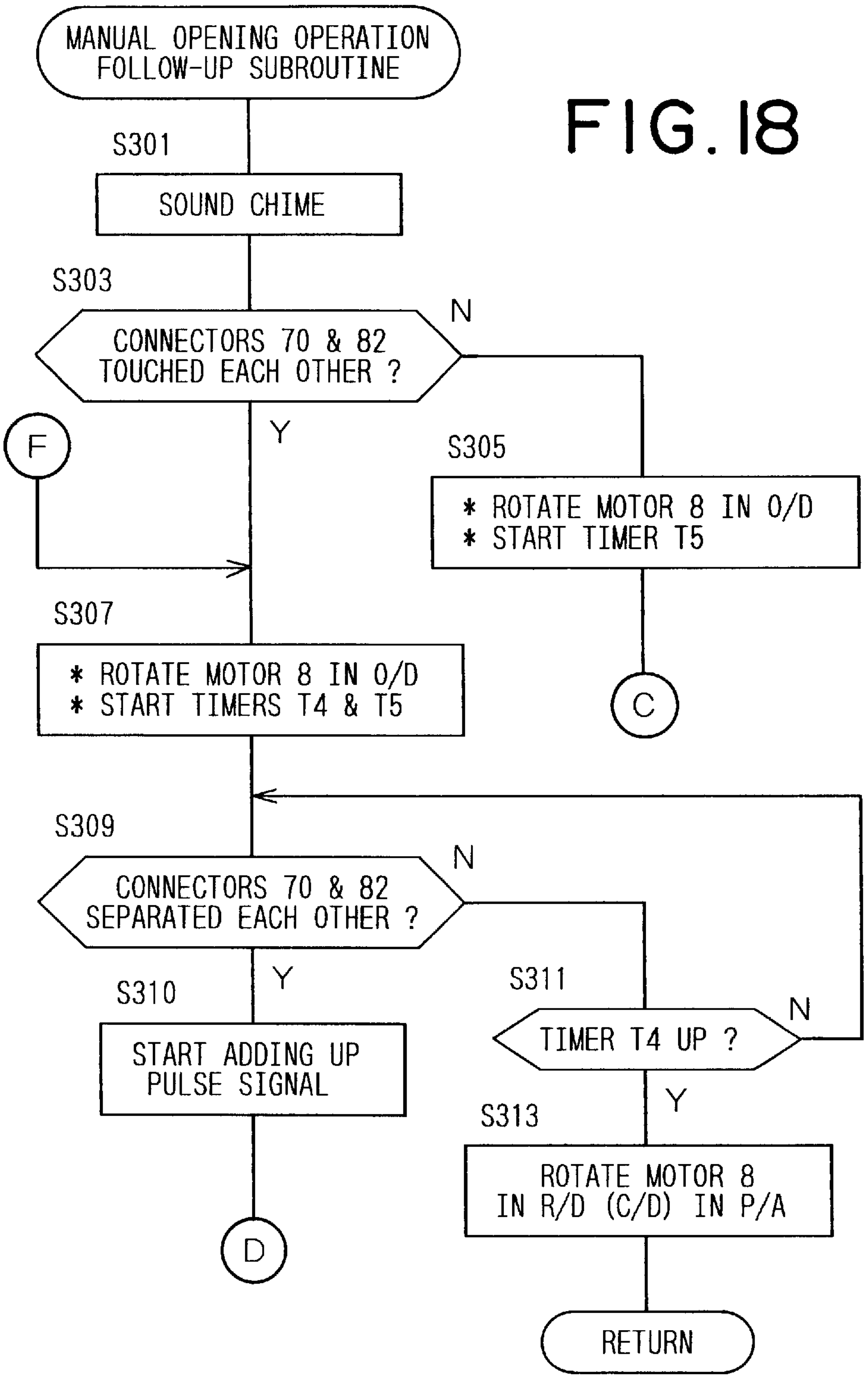
FIG. 18 is a flowchart of a manual closing operation follow-up subroutine.
Figure 19A:
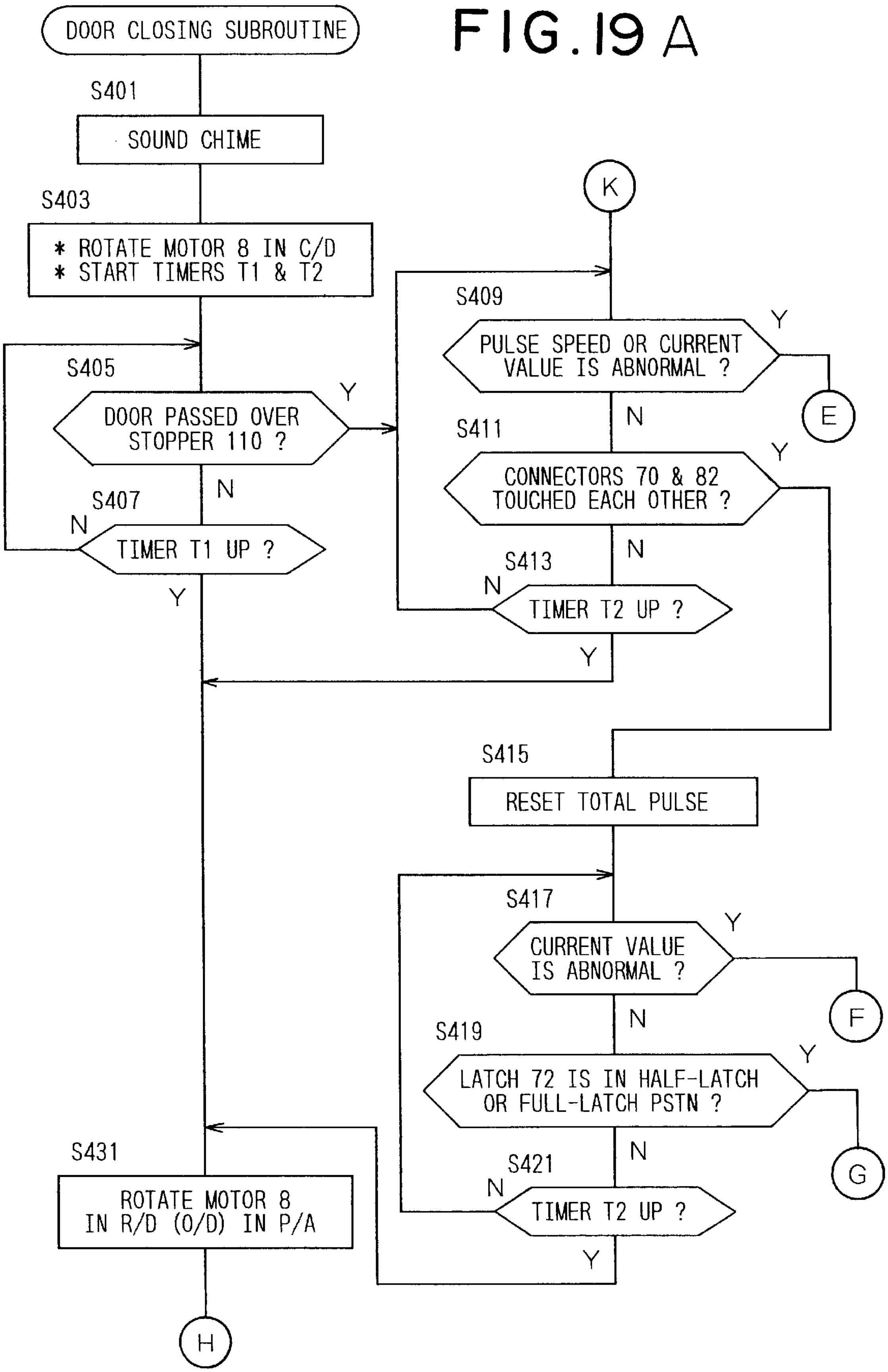
FIGS. 19A to 19C are flowcharts of a door closing subroutine.
Figure 19B:
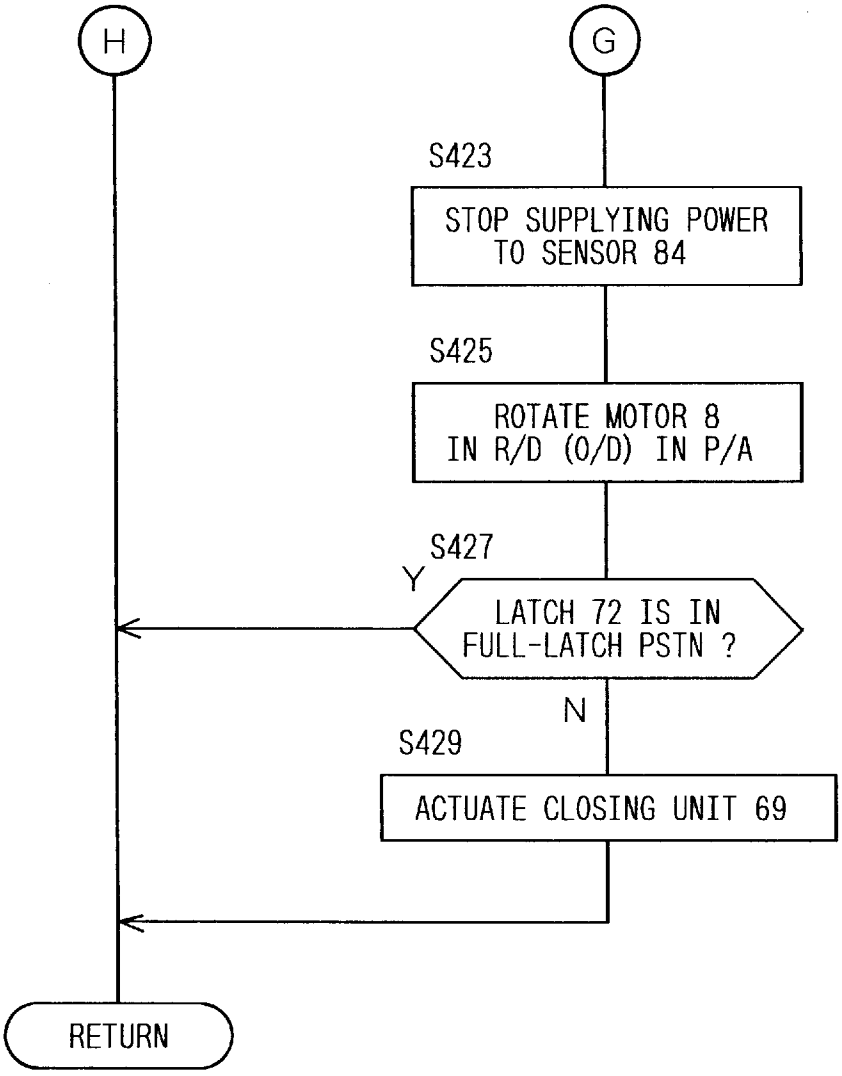
Figure 19C:
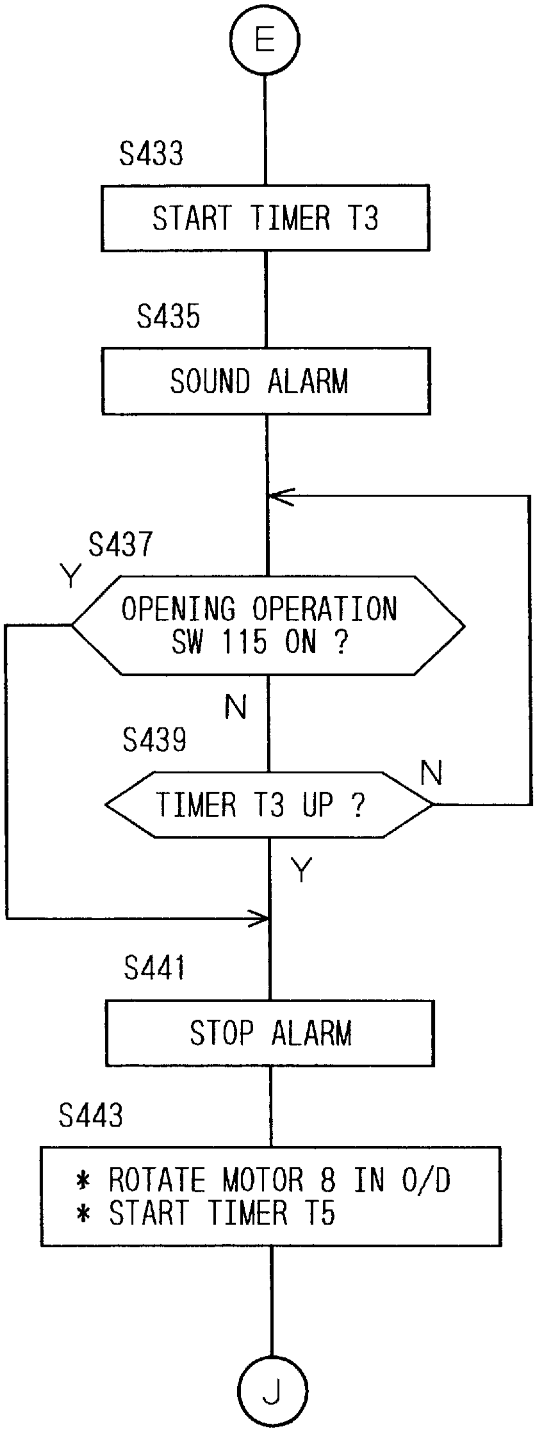
Figure 20:
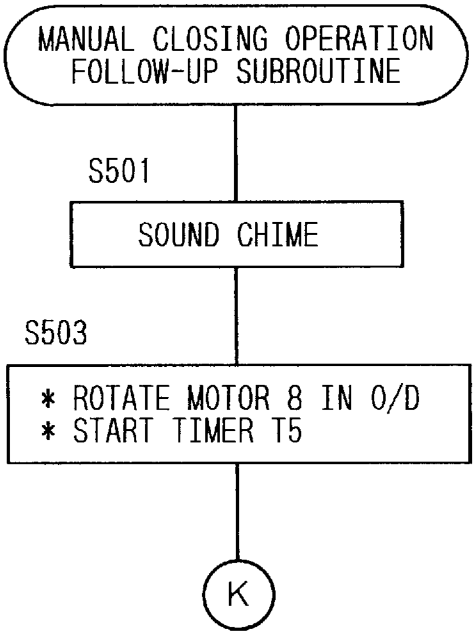
FIG. 20 is a flowchart of a manual closing operation follow-up subroutine.

If the sliding movement of the door 5 in the opening direction is detected in step S005 of the main routine, the control of the controller 87 is passed to the "Manual Opening Operation Follow-up Subroutine" of FIG. 18. And when the latch 72 is released from the striker 71 in step S011 of the main routine, the control is also passed to the "Manual Opening Operation Follow-up Subroutine".

If the sliding movement of the door 5 in the closing direction is detected in step S009 of the main routine, it is checked whether or not the sliding door 5 is at the full-open position in step S025. When the door is not at the full-open position, the control of the controller 87 is passed to the "Manual Closing Operation Follow-up Subroutine" of FIG. 20. However, when the door is at the full-open position, a timer T6 is started (S027), and only when the door gets over the full-open stopper 110 within the time of the timer T6 (S029), the control is passed to the "Manual Closing Operation Follow-up Subroutine". Further, when the door 5 is not at the full-open position in step S019, the control is also passed to the "Manual Closing Operation Follow-up Subroutine".

In the manual closing operation follow-up subroutine, the chime is sound (S501), and then the motor 8 of the powered sliding unit 7 is rotated in the closing direction, and the timer T2 is started (S503). Thereby, the sliding door 5 is slid in the closing direction. Then, when the control of the controller 87 is passed to the step S409 of the "Door Closing Subroutine", thereby the sliding door 5 is closed by power as already described.

In this invention, as described above, the amount of rotation of the wire drum 10 is determined by adding up or subtracting from the number of the pulses of the signal sent from the optical sensor 84. However, other methods for determining the amount of rotation from the pulse signal can be used. The method is not limited to the above-described one.

The foregoing discussion discloses and describes merely exemplary embodiment of the present invention only. One skilled in the art will readily recognize from such discussion, and from the accompanying drawings and claims, that various changes, modifications and variations can be made therein without departing from the spirit and scope of the invention as defined in the following claims.

What is claimed is:

1. A powered sliding device comprising:

a base plate fixable to a vehicle body;

a wire drum rotatably mounted on the base plate by a drum shaft and rotated by a motor;

a wire cable wound around the wire drum and disposable between the wire drum and a vehicle door for pulling the door in an opening direction or in a closing direction when the wire drum rotates;

a tension shaft slidably mounted on the base plate in a given direction, said tension shaft having a tension roller which makes contact with the wire cable;

a movable member slidably mounted on the base plate in a direction perpendicular to the given direction; and a coupling member having one end rotatably connected to the tension shaft and the other end rotatably connected to the movable member.

2. The door sliding device according to claim 1, further comprising a rack portion formed on the movable member, and a pinion gear meshed with the rack portion for sliding the movable member in the perpendicular direction when the pinion gear is rotated.

3. The door sliding device according to claim 2, wherein said pinion gear has an engaging portion with which a tool is engageable.

4. The door sliding device according to claim 3, further comprising a ratchet wheel fixed to a shaft of the pinion gear, and a pawl lever engaged with the ratchet wheel by resilient force of a spring for permitting the pinion gear to rotate in an one-way direction.

5. The door sliding device according to claim 1, wherein said given direction coincides with a radial direction of the drum shaft.

6. The door sliding device according to claim 5, wherein each side of a contact portion of the wire cable relatively to the tension roller extends straight toward the wire drum.

7. The door sliding device according to claim 1, wherein said coupling member has a forked portion between which the tension roller is rotatably installed.

8. The door-sliding device according to claim 3, wherein the tool comprises a screwdriver.

* * * * *